(12) United States Patent
Yuki

(10) Patent No.: US 7,948,160 B2
(45) Date of Patent: May 24, 2011

(54) OPTICAL DEVICE AND MANUFACTURING METHOD OF THE OPTICAL DEVICE

(75) Inventor: Toshinao Yuki, Yamagata (JP)

(73) Assignee: Tohoku Pioneer Corporation, Yamagata (JP)

( * ) Notice: Subject to any disclaimer, the term of this patent is extended or adjusted under 35 U.S.C. 154(b) by 480 days.

(21) Appl. No.: 12/162,181

(22) PCT Filed: Jan. 27, 2006

(86) PCT No.: PCT/JP2006/301354
§ 371 (c)(1),
(2), (4) Date: Jul. 25, 2008

(87) PCT Pub. No.: WO2007/086137
PCT Pub. Date: Aug. 2, 2007

(65) Prior Publication Data
US 2009/0026943 A1    Jan. 29, 2009

(51) Int. Cl.
*H01J 1/62*      (2006.01)
*H01J 63/04*    (2006.01)
(52) U.S. Cl. ........... 313/498; 313/505; 313/506; 445/24
(58) Field of Classification Search .............. 313/505, 313/504, 498, 500, 506; 427/66; 445/23, 445/24
See application file for complete search history.

(56) References Cited

U.S. PATENT DOCUMENTS

| | | | | |
|---|---|---|---|---|
| 5,703,436 | A  * | 12/1997 | Forrest et al. | 313/506 |
| 6,137,222 | A  * | 10/2000 | Ishihara et al. | 313/506 |
| 6,366,016 | B1 * |  4/2002 | Sakaguchi et al. | 313/506 |
| 6,656,519 | B2 * | 12/2003 | Sakaguchi et al. | 427/68 |
| 2005/0174044 | A1 * | 8/2005 | Miura | 313/504 |

FOREIGN PATENT DOCUMENTS

JP    2003-123971 A    4/2003

* cited by examiner

*Primary Examiner* — Nimeshkumar D Patel
*Assistant Examiner* — Glenn Zimmerman
(74) *Attorney, Agent, or Firm* — Arent Fox LLP

(57) ABSTRACT

An optical device emitting light of a predetermined mixed color other than the intrinsic colors of light emitting layers from each pixel having a reduced number of drive lines (electrodes) to achieve the color. The optical device includes one or a plurality of self light emitting elements, each corresponding to one pixel and including a pair of electrodes formed on a substrate and at least a light emitting layer between the electrodes. The light emitting layer includes a first layer with a first region that emits light of a first color and a second layer with a second region that emits light of a second color that is different from the first within the same opening of each pixel. A third light emitting region is formed within the opening for emitting light of a color that is a mixture of the first color and the second color.

11 Claims, 15 Drawing Sheets

1a

FIG.5
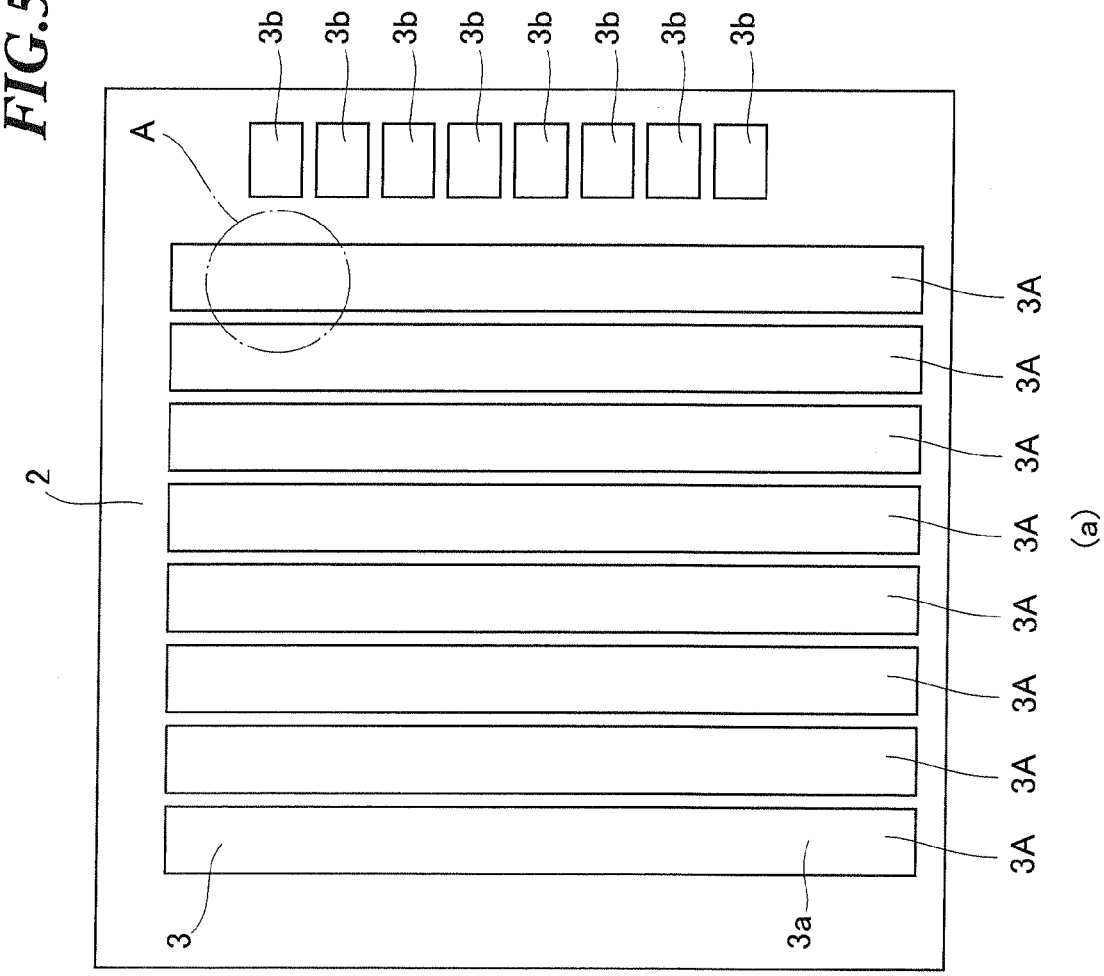
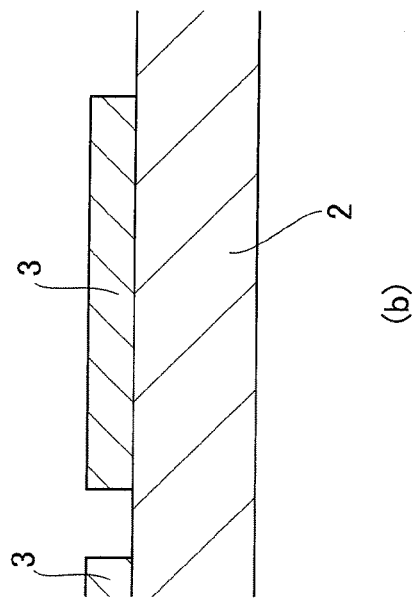

FIG.9
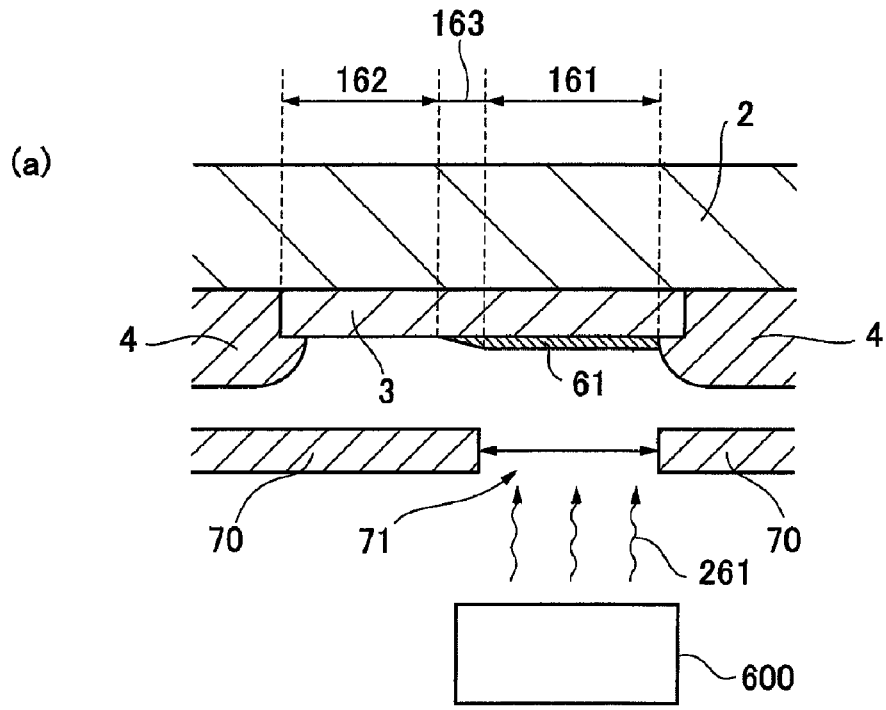
(a)
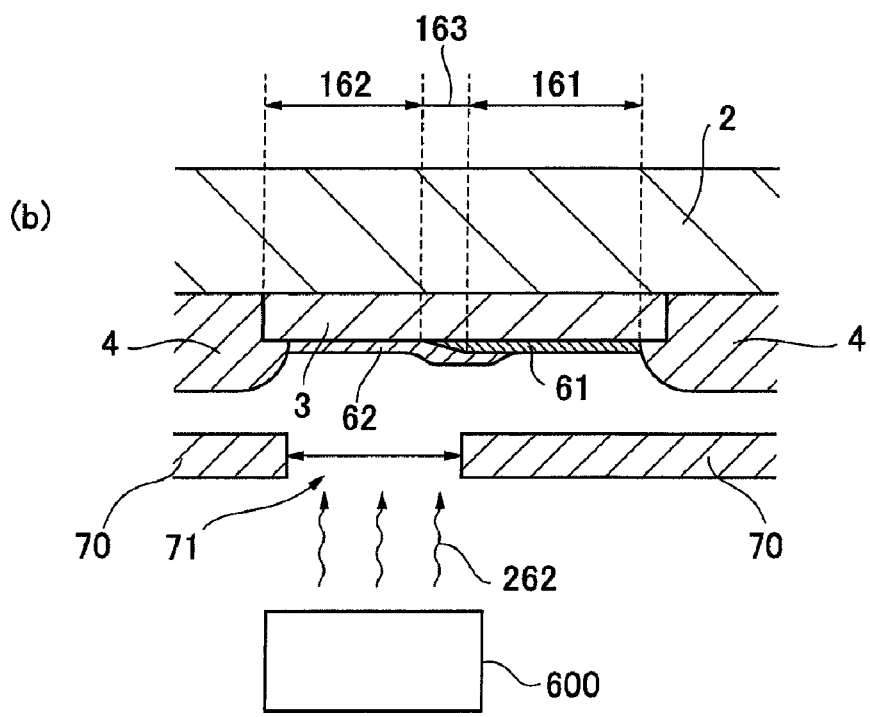
(b)

OPTICAL DEVICE AND MANUFACTURING METHOD OF THE OPTICAL DEVICE

CROSS-REFERENCE TO RELATED APPLICATION

This application is a National Stage entry of International Application No. PCT/JP2006/301354, filed Jan. 27, 2006, the entire specification claims and drawings of which are incorporated herewith by reference.

TECHNICAL FIELD

The present invention relates to an optical device and a manufacturing method of the optical device.

BACKGROUND ART

The optical device is employed in various devices, including: information display devices with dot matrix display such as monitors of portable phones, in-vehicle systems, or household electric appliances, display devices for personal computers, and TV receivers; fixed display devices such as clocks or advertising panels; illumination devices such as a power source of a scanner or a printer, lighting, or LCD backlight; and optical communication devices that use photoelectric conversion functions. An optical device generally consists of multiple pixels such that by switching on or off each of the pixels, predetermined information is displayed. Some known optical devices employ self light emitting elements for the pixels. A self light emitting element has the advantages of low power consumption and no need for a backlight and has found various applications ranging from small-scale optical devices to larger ones such as large screens, including optical panels with multiple self light emitting elements arranged in a dot matrix, displays with icons (fixed display parts), and flat or spherical lighting equipment.

Self light emitting elements include inorganic EL elements, organic EL elements, FED elements, and light emitting diodes; an organic electroluminescence (EL) element is the typical example. An organic EL element is also referred to as an organic electroluminescence (OEL) device, an organic light emitting diode (OLED) device, a self light emitting element, or an electroluminescence light source. An organic EL element generally has a structure in which an organic layer (corresponding to a light emitting layer) is interposed between an anode (hole injecting electrode) and a cathode (corresponding to an electron injecting layer). The organic layer usually has a multilayer structure, each layer having its own function, and for example, a hole injecting layer, a hole transporting layer, an organic light emitting layer, an electron transporting layer, an electron injecting layer, and others are layered upon one another in consecutive order. Each of these layers may be a single layer made of a single organic material, a mixed layer of a mixture of several materials, or a layer containing organic or inorganic materials having respective functions (charge transporting function, light emitting function, charge blocking function, optical function and the like) dispersed in a polymer binder. Some other known organic EL elements include a buffer function for each layer to prevent the organic layer from being damaged during formation of an upper electrode by a sputtering method, or a planarizing function to reduce surface roughness resulting from film forming processes.

In the organic EL element having the above structure, when a voltage is applied across the electrodes, holes injected from the anode and transported into the organic layer and electrons injected from the cathode and transported into the organic layer recombine in the organic layer. The recombination causes a transition of electrons of the organic molecules in the organic layer from the ground state to an excited state, and the transition of the electrons from the excited state back to the ground state results in emission of light.

The color of light emitted from an organic EL element is substantially defined by the material of the organic layer, which is the light emitting layer. Various techniques are known for emitting light of a predetermined color, including: forming the organic layer from a luminescent material that emits light of a predetermined color; a filtering method wherein light from the organic layer is emitted through a color filter; a color conversion method wherein a fluorescent layer absorbs light from the organic layer and emits light of a predetermined color; using various luminescent materials mixed in one organic layer; and an additive color mixing method that uses mixing of colors to achieve light of a predetermined color (see for example Patent Document 1). The additive color mixing method has the advantage that a predetermined color other than the intrinsic color of the organic layer can be achieved with a simple structure without the need of providing a filter or a fluorescent layer.

A conventional light emitting panel device that emits light of a predetermined color (for example white) using this additive color mixing method controls driving of pixels of various types of colors (for example red pixels, blue pixels etc.) to emit light of a predetermined mixed color (for example white light).

Patent Document 1: Japanese Published Unexamined Patent Application No. 2003-123971

DISCLOSURE OF THE INVENTION

Problems to be Solved by the Invention

However, with the light emitting panel device that emits light of a predetermined color using the above-noted additive color mixing method, it is necessary to provide pixels for each of the various types of colors as well as drive lines (drive electrodes) electrically connected to each one of the pixels, through which these pixels are driven. Thus one problem is that the numbers of pixels and drive lines necessary for achieving light of the predetermined color are relatively large. Another problem with this light emitting panel device is that, since it is necessary to drive the pixels of various types of colors to obtain light of the predetermined color, the ratio of an area effectively used for the emission of the particular color light per specified area of the light emitting panel (also referred to as "aperture ratio necessary for achieving a predetermined color") is small as compared to, for example, other light emitting panel devices that emit the predetermined color light from one pixel.

Yet another problem with the above light emitting panel device is that, while the predetermined color light is visible macroscopically due to the additive mixing of colors, intrinsic colors of the pixels become visible separately in proximity to the light emitting panel. A light emitting device is therefore desirable that can emit the predetermined color light from each pixel using additive mixing of colors, without any such problem when viewed in proximity.

An organic EL element having several organic layers of various types of colors simply stacked upon one another emits light of a mixed color of the lights from the organic layers. When the film thickness of each organic layer in each of the pixels is not uniform, there will be variation in color among the pixels. It is therefore necessary to control the film thickness highly precisely to achieve the predetermined color. Also when several organic layers of various types of colors are simply stacked upon one another, they need to have at least one of electron transportability and hole transportability. This causes the problem that there are many limitations on selection of the organic materials and the manufacturing processes.

These issues are dealt with as part of the problems to be solved by the present invention. More specifically, an object of the present invention is to provide an optical device capable of emitting light of a predetermined color (mixed color) other than an intrinsic color of the organic (light emitting) layer from each pixel with a simple structure. Another object is to reduce the number of drive lines (electrodes) necessary for achieving the predetermined color (mixed color). Yet another object is to increase the aperture ratio necessary for achieving the predetermined color (mixed color). A further object is to provide a manufacturing method of an optical device capable of emitting light of a predetermined color (mixed color) other than an intrinsic color of the organic layer from each pixel with simple process steps.

Means for Solving the Problems

To achieve these objects, the present invention includes at least the following features according to each one of the independent claims:

The present invention as defined in claim 1 provides an optical device including one or a plurality of self light emitting elements, each of which serves as one pixel and includes a pair of electrodes formed on a substrate and at least a light emitting layer interposed between the electrodes. The light emitting layer includes, within one pixel, a first light emitting layer that at least emits light of a first color and a second light emitting layer that emits light of a second color that is different from the first color. Each pixel includes, within an identical opening, a first light emitting region that emits light of the first color and a second light emitting region that emits light of the second color.

The present invention as defined in claim 2 provides an optical device including one or a plurality of self light emitting elements, each of which serves as one pixel and includes a pair of electrodes formed on a substrate and at least a light emitting layer interposed between the electrodes. The light emitting layer includes, within one pixel, a first light emitting layer that at least emits light of a first color and a second light emitting layer that emits light of a second color that is different from the first color. Each pixel includes, within an identical opening, a first light emitting region that emits light of the first color, a second light emitting region that emits light of the second color, and a third light emitting region that emits light of a color that is a mixture of the first color and the second color.

The present invention as defined in claim 10 provides a method for manufacturing an optical device including one or a plurality of self light emitting elements, each of which is one pixel and includes a pair of electrodes and at least a light emitting layer interposed between the electrodes. The method includes: a first step of forming a first electrode directly or via another layer on a substrate; a second step of providing an insulating layer partitioned into sections on the first electrode so as to form openings that function as pixels; a third step of forming a light emitting layer in the openings; and a fourth step of forming a second electrode directly or via another layer on the light emitting layer. In the third step, the light emitting layer including a first light emitting layer that emits at least light of a first color and a second light emitting layer that emits light of a second color that is different from the first color is provided in each one of the pixels, and a first light emitting region that emits the first color light and a second light emitting region that emits the second color light are formed in an identical opening of the one pixel.

The present invention as defined in claim 11 provides a method for manufacturing an optical device including one or a plurality of self light emitting elements, each of which is one pixel and includes a pair of electrodes and at least a light emitting layer interposed between the electrodes. The method includes: a first step of forming a first electrode directly or via another layer on a substrate; a second step of providing an insulating layer partitioned into sections on the first electrode so as to form openings that function as pixels; a third step of forming a light emitting layer in the openings; and a fourth step of forming a second electrode directly or via another layer on the light emitting layer. In the third step, the light emitting layer including a first light emitting layer that emits at least light of a first color and a second light emitting layer that emits light of a second color that is different from the first color is provided in each one of the pixels, and a first light emitting region that emits the first color light, a second light emitting region that emits the second color light, and a third light emitting region that emits light of a color that is a mixture of the first color and the second color are formed in an identical opening of the one pixel.

The present invention as defined in claim 14 provides a method for manufacturing an optical device including one or a plurality of self light emitting elements, each of which is one pixel and includes a pair of electrodes and at least a light emitting layer interposed between the electrodes. The method includes: a first electrode formation step of forming a first electrode directly or via another layer on a substrate; a pixel region formation step of providing an insulating layer partitioned into sections on the first electrode so as to form openings that function as pixels; a first light emitting layer formation step of forming a first light emitting layer on part of the opening of one of the pixels; a second light emitting layer formation step of forming a second light emitting layer on part of the region in the same opening of one of the pixels where the first light emitting layer has been formed and on a region where the first light emitting layer has not been formed; and a second electrode formation step of forming a second electrode after the formation of the second light emitting layer.

BRIEF DESCRIPTION OF THE DRAWINGS

FIG. 5 includes diagrams given for explanation of a step of forming a first electrode in the manufacturing method of the optical device according to one embodiment of the present invention, FIG. 5A being a top plan view and FIG. 5B being a cross section of the region A and its surroundings in FIG. 5A.

FIG. 9 includes diagrams given for explanation of film forming processes in the manufacturing method of the optical device according to one embodiment of the present invention, FIG. 9A illustrating one specific example of a step of forming a first light emitting layer and FIG. 9B illustrating one specific example of forming a second light emitting layer.

BEST MODE FOR CARRYING OUT THE INVENTION

Figure 1:
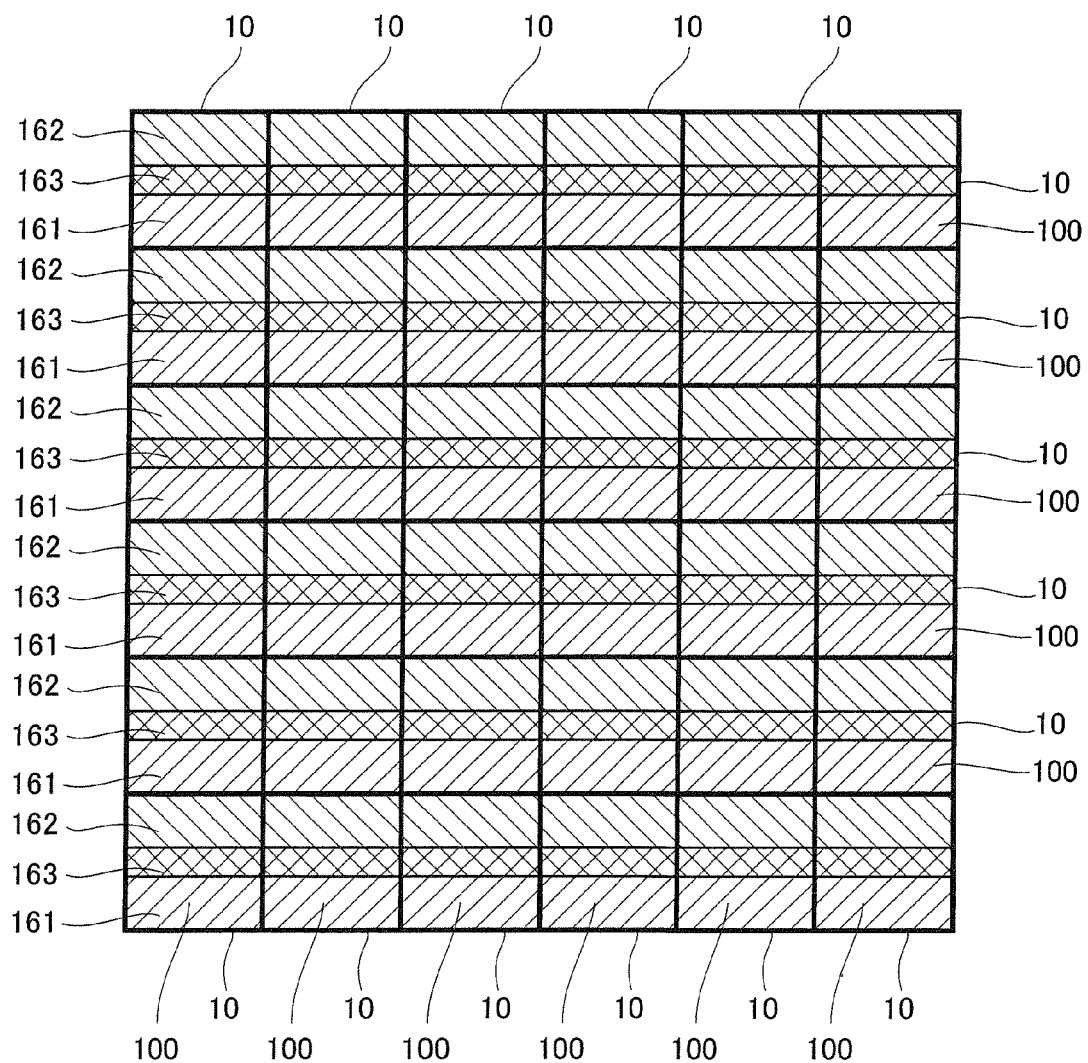
FIG. 1 is a diagram given for explanation of an optical device 1 according to a first embodiment of the present invention.

The optical device according to one embodiment of the present invention includes one or a plurality of self light emitting elements, each of which serves as one pixel and includes a pair of electrodes formed on a substrate and at least a light emitting layer interposed between the electrodes. The light emitting layer includes, within one pixel, a first light emitting layer that at least emits light of a first color and a second light emitting layer that emits light of a second color that is different from the first color, and each pixel includes, within an identical opening, a first light emitting region that emits the first color light and a second light emitting region that emits the second color light. The optical device includes, within an identical opening in each pixel, a first light emitting region that emits the first color light, a second light emitting region that emits the second color light, and a third light emitting region that emits light of a color that is a mixture of the first color and the second color.

Preferably, the first light emitting layer and the second light emitting layer are laminated upon one another in the third light emitting region. Also preferably, the third light emitting region is formed between the first light emitting region and the second light emitting region within the identical opening of each pixel.

According to the optical device with the structure described above, the light emitting layer includes, within one pixel, a first light emitting layer that at least emits light of a first color and a second light emitting layer that emits light of a second color that is different from the first color, and each pixel includes, within an identical opening, a first light emitting region that emits the first color light and a second light emitting region that emits the second color light. Thus the optical device is capable of emitting light of a predetermined color (macroscopically mixed color) other than the intrinsic colors of the light emitting layers from each one of the pixels.

Moreover, since the identical opening of each pixel includes a first light emitting region, a second light emitting region, and a third light emitting region that emits light of a color that is a mixture of the first color and the second color, the optical device is capable of emitting the first color light, the second color light, and light of a mixed color of the first and second colors from each one of the pixels.

With a conventional light emitting panel device that drives pixels of several types of colors, for example, intrinsic colors of the pixels become visible separately in proximity to the light emitting panel. In contrast, with the optical device according to the present invention having the structure described above, since each pixel emits the first color light, the second color light, and light of a mixed color of the first and second colors, one sees even in closer proximity as compared to the conventional case that each pixel emits a predetermined color (mixed color). For example, when the optical device according to the present invention adopts a red light emitting layer as the first light emitting layer and a blue light emitting layer as the second light emitting layer, each pixel is capable of emitting white light, which is achieved by mixing of the two colors.

Moreover, with the optical device according to the present invention, the identical opening of each pixel includes at least a first light emitting region and a second light emitting region and preferably a third light emitting region, whereby the number of drive lines (electrodes) necessary for achieving a predetermined color (mixed color) is reduced as compared to the conventional light emitting panel device that drives the pixels of several types of colors.

Furthermore, with the optical device according to the present invention, the identical opening of each pixel includes at least the first light emitting region and the second light emitting region and preferably the third light emitting region, whereby the aperture ratio necessary for achieving a predetermined color (mixed color) is increased as compared to the conventional light emitting panel device that drives the pixels of several types of colors, the pixels being arranged, for example, in a flat plane panel.

Moreover, by suitably setting, for example the materials and film thickness of the first and second light emitting layers, or the area of each light emitting region, the optical device according to one embodiment of the present invention is capable of emitting light of a predetermined color (mixed color) from each one of the pixels and thereby better color representation is achieved as compared to the conventional techniques.

The method for manufacturing an optical device according to one embodiment of the present invention is a manufacturing method of an optical device including one or a plurality of self light emitting elements, each of which is one pixel and includes a pair of electrodes and at least a light emitting layer interposed between the electrodes. The method includes: a first step of forming a first electrode directly or via another layer on a substrate; a second step of providing an insulating layer partitioned into sections on the first electrode so as to form openings that functions as pixels; a third step of forming a light emitting layer in the openings; and a fourth step of forming a second electrode directly or via another layer on the light emitting layer. In the third step, the light emitting layer including a first light emitting layer that emits at least light of a first color and a second light emitting layer that emits light of a second color that is different from the first color is provided, in each one of the pixels, and a first light emitting region that emits the first color light and a second light emitting region that emits the second color light are formed in an identical opening of each pixel.

Preferably, the third step involves formation of a first light emitting region that emits the first color light, a second light emitting region that emits the second color light, and a third light emitting region that emits light of a mixed color of the first and second colors in the identical opening of each pixel. In this instance, the first light emitting layer and the second light emitting layer are preferably laminated upon one another in the third light emitting region. The third light emitting region is also preferably formed between the first light emitting region and the second light emitting region.

The method for manufacturing an optical device according to one embodiment of the present invention is a manufacturing method of an optical device including one or a plurality of self light emitting elements, each of which is one pixel and includes a pair of electrodes and at least a light emitting layer interposed between the electrodes. The method includes: a first electrode formation step of forming a first electrode directly or via another layer on a substrate; a pixel region formation step of providing an insulating layer partitioned into sections on the first electrode so as to form openings that functions as pixels; a first light emitting layer formation step of forming a first light emitting layer on part of the opening of each pixel; a second light emitting layer formation step of forming a second light emitting layer on part of the region in the same opening of each pixel where the first light emitting layer has been formed and on a region where the first light emitting layer has not been formed; and a second electrode formation step of forming a second electrode after the formation of the second light emitting layer.

With the manufacturing method of the optical device according to one embodiment of the present invention, an optical device capable of emitting, from each pixel, light of a predetermined color (mixed color) other than the intrinsic colors of the organic layers is produced through simple process steps.

Hereinafter, the optical device and the method of manufacturing the optical device according to one embodiment of the present invention will be described with reference to the drawings.

FIRST EMBODIMENT

Figure 2:
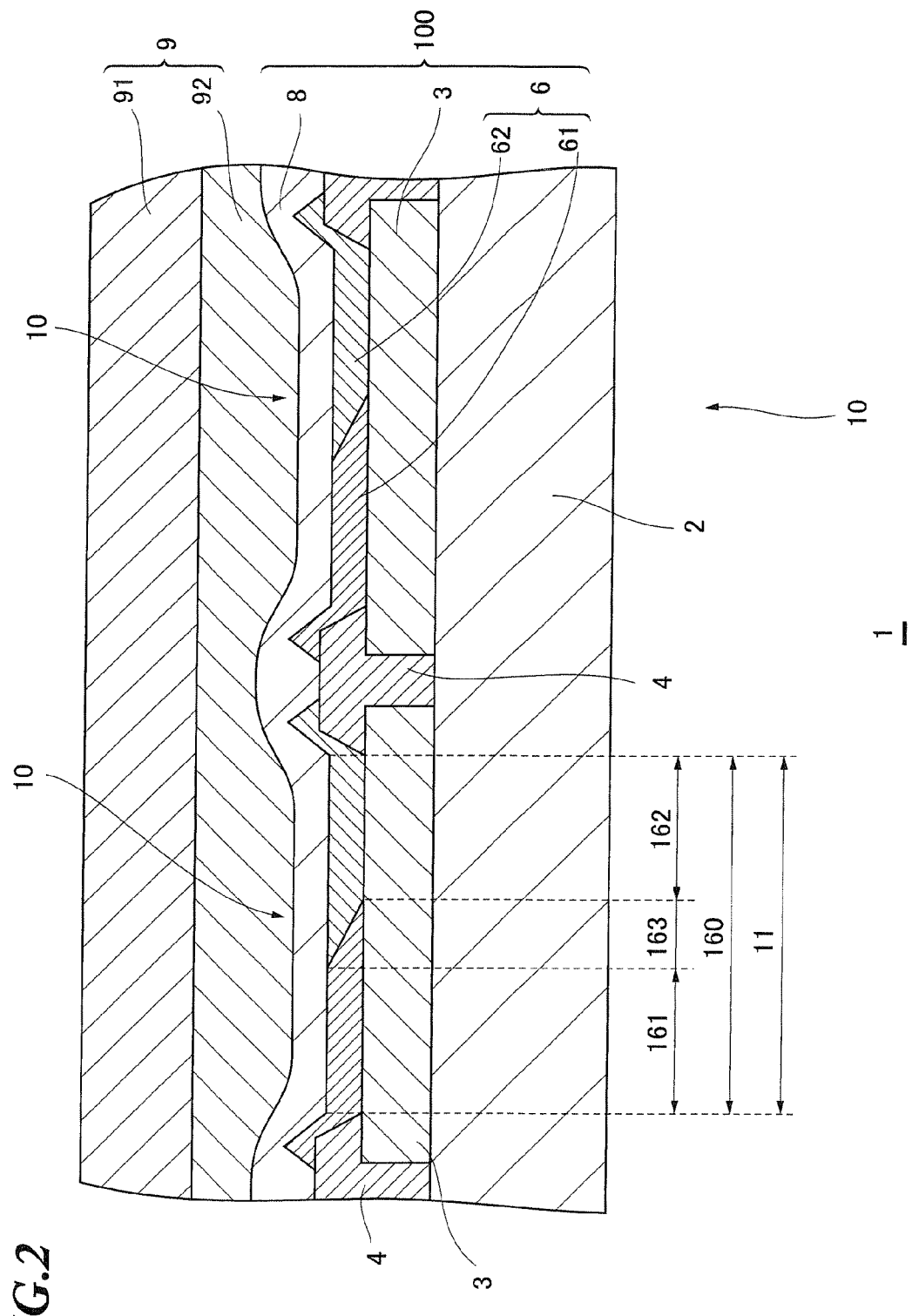
FIG. 2 is a cross-sectional view illustrating, to a larger scale, the self light emitting element and its surroundings of the optical device shown in FIG. 1.

FIG. 1 is a diagram given for explanation of an optical device according to a first embodiment of the present invention. FIG. 2 is a cross-sectional view illustrating, to a larger scale, the self light emitting element and its surroundings of the optical device shown in FIG. 1. FIG. 1 corresponds to a plan view from the side of the substrate shown in FIG. 2. The optical device 1 according to one embodiment of the present invention includes one pixel 10 or a plurality of pixels 10 as shown in FIG. 1 and FIG. 2. In the present embodiment, a plurality of pixels 10 are aligned in a grid as shown in FIG. 1. In the optical device 1, one self light emitting element 100 corresponds to one pixel, and the light emitting layer formed between the electrodes of each element is turned on to emit light or turned off so as to display various information. The self light emitting element 100 can be any of an inorganic EL element, an organic EL element, an FED element, or a light emitting diode. One example of a bottom-emission, passive matrix organic EL panel will be hereinafter described, in which the optical device according to one embodiment of the present invention is employed. This organic El panel employs organic EL elements as the self light emitting elements 100.

The optical device 1 according to the present embodiment includes a substrate 2, a first electrode 3, an insulating film 4, a light emitting layer 6, a second electrode 8, and a sealing member 9, as shown in FIG. 1 and FIG. 2. The substrate 2 may preferably be in the form of a flat plate or a film and can be made of glass or plastic. In a bottom-emission type optical device, for example, the substrate 2 is formed of a material having transparency. The first electrode 3 is made of a conductive material and formed directly or via another layer (such as a protection layer or the like) on the substrate 2. The insulating film 4 is made of an insulating material such as polyimide or the like and layered in between and upon the first electrodes 3 such as to form an opening 11 above each first electrode 3. The light emitting layer 6 is formed directly or via another layer (such as a charge transporting layer or the like) on the first electrode 3 within each of the openings 11, which are formed by the insulating film 4 partitioned into sections. The region within the opening 11 of the light emitting layer 6 is a light emitting region 160. The second electrode 8 is made of a conductive material and is formed directly or via another layer (such as a charge transporting layer or the like) on the light emitting layer 6. The self light emitting element 100 is composed of the first electrode 3, light emitting layer 6, and second electrode 8 described above. Moisture or the like will significantly deteriorate the self light emitting element 100, so the sealing member 9 is provided to seal the self light emitting element 100 and prevent its deterioration. The sealing member 9 in the present embodiment includes, as shown in FIG. 2, a sealing substrate 91 made of a suitable material such as glass or metal and a sealant 92 made of a suitable material such as resin. The sealing substrate 91 alone can provide a seal, with the sealant 92 being replaced with a space which contains a desiccant, or, a film of sealant 92 alone can provide a seal.

In the self light emitting element 100 having the above structure, when a voltage is applied across the first and second electrodes 3 and 8, electrons are injected from the cathode, which is formed on either side of the first and second electrodes 3 and 8, while holes are injected from the anode, which is formed on the other side of the first and second electrodes 3 and 8, and these electrons and holes recombine in the light emitting layer 6. The recombination causes a transition of electrons of the organic molecules in the light emitting layer 6 from the ground state to an excited state, and the transition of the electrons from the excited state back to the ground state results in emission of light.

Next, the light emitting layer 6 will be described in more detail. As shown in FIG. 1 and FIG. 2, the light emitting layer 6 interposed between the pair of electrodes 3 and 8 has a plurality of light emitting regions in each one of the pixels 10. At least one of these light emitting regions has a structure that enables emission of mixed-color light.

More specifically, the light emitting layer 6 includes, as shown in FIG. 1 and FIG. 2, a first light emitting layer 61 that emits light of a first color, and a second light emitting layer 62 that emits light of a second color that is different from the first color. The light emitting layer 6 includes a first light emitting region 161 that emits light of a first color, and a second light emitting region 162 that emits light of a second color that is different from the first color within each one of the pixels 10 (openings 11) on the same plane (on the first electrode). Moreover, the light emitting layer 6 in the present embodiment is provided with a third light emitting region 163 that emits light of a color that is a mixture of the first and second colors within the same opening 11 of each pixel. The third light emitting region 163 is formed between the first and second light emitting regions 161 ad 162 within the same opening 11 of each pixel. The first and second light emitting layers 61 and 62 are laminated upon one another in the third light emitting region 163 so that it can emit light of a color that is a mixture of the first and second colors of the first and second light emitting layers 61 and 62.

The first light emitting layer 61 is preferably thinner in the third light emitting region 163 than in the first light emitting region 161. Likewise, the second light emitting layer 62 is preferably thinner in the third light emitting region 163 than in the second light emitting region 162. With the first and second light emitting layers 61 and 62 being formed as described above, the entire film thickness of the light emitting layer in the third light emitting region 163 is prevented from becoming notably larger than those in the first and second light emitting regions 161 and 162. The film thickness of the first or second light emitting layer 61 or 62 in the third light emitting region 163 is not limited to the specifics of the embodiment above, but is preferably set suitably so as to, for example, achieve emission of light of a predetermined color (mixed color).

FIG. 3A is a diagram given for explanation of light emission from each of the light emitting regions within one pixel of the optical device shown in FIG. 2. FIG. 3B represents the light spectrum of the first light from the first light emitting region 161, FIG. 3C represents the light spectrum of the second light from the second light emitting region 162, and FIG. 3D represents the light spectrum of the light from the third light emitting region 163. The horizontal axis represents the wavelength and the vertical axis represents the light intensity in FIG. 3B to FIG. 3D.

Figure 3:
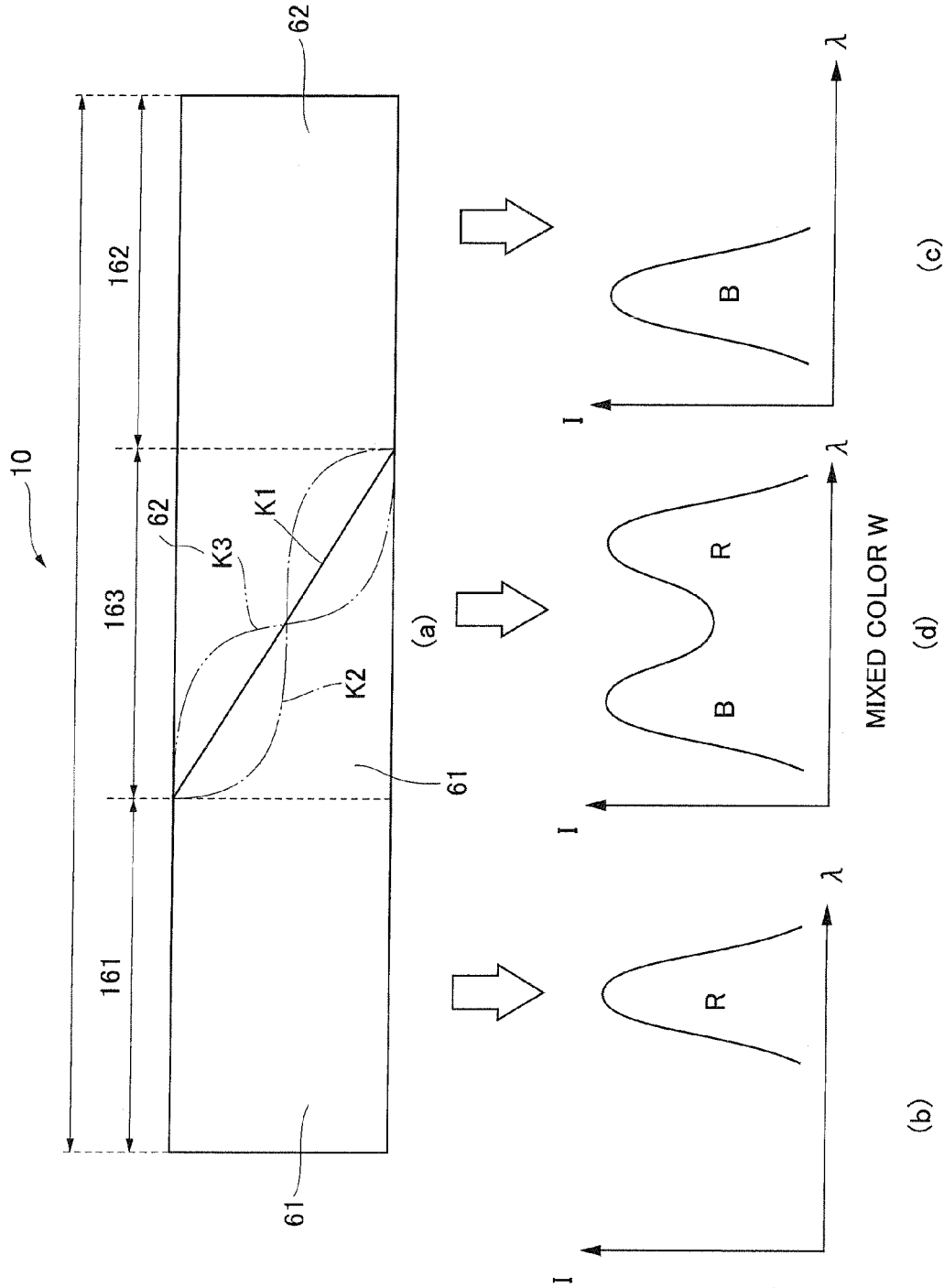
FIG. 3 includes diagrams given for explanation of light emission from each of the light emitting regions of one pixel of the optical device of FIG. 2.

More specifically, the first light emitting layer 61 is made, for example, of a luminescent material that emits red light such as a styryl dye (DCM1), while the second light emitting layer 62 is made of a luminescent material that emits blue light such as a distyryl derivative or a triazole derivative. The first and second light emitting layers 61 and 62 are formed such that they overlap each other in part of the opening 11 (third light emitting region 163). As shown in FIG. 1 to FIG. 3, from the same opening 11 of each pixel 10, the first light emitting region 161 emits red light, the second light emitting region 162 emits blue light, and the third light emitting region 163 emits light, which is eventually white, as a result of additive mixture of red and blue of the lights from the first and second light emitting layers 61 and 62. More specifically, the color of the light from the third light emitting region 163 is determined by the light intensity of the lights from the first and second light emitting layers 61 and 62 in the third light emitting region 163.

As shown in FIG. 2 and FIG. 3, in the third light emitting region 163 in the present embodiment, the film thickness of the first light emitting layer 61 decreases from the side of the first light emitting region towards the second light emitting region, while the film thickness of the second light emitting layer 62 increases from the side of the first light emitting region towards the second light emitting region. The lamination structure in this third light emitting region 163 is not limited to this form in the present embodiment. For example, as shown in FIG. 3A, the film thickness profile of the first and second light emitting layers 61 and 62 may be substantially linear (K1) from the first light emitting region to the second light emitting region, or the film thickness profile may be substantially constant near the center of the third light emitting region 163 with large gradient changes near both ends thereof (K2). Alternatively, the film thickness profile may be substantially constant near both ends of the third light emitting region 163 with large gradient changes near the center thereof (K3).

It is preferable to determine the film thickness and area of each of the first and second light emitting layers 61 and 62 so that the mixed color of light emitted from the third light emitting region 163 will be the predetermined color (mixed color). This lamination structure allows the third light emitting region 163 to emit light of a predetermined mixed color.

It is also preferable to determine the area ratio between the first and second light emitting regions 161 and 162 and the film thickness of respective light emitting layers so that the lights from the first and second light emitting regions 161 and 162 will produce a predetermined color (mixed color) by additive mixing of colors. Furthermore, it is preferable to determine the area ratio between the first to third light emitting regions 161 to 163 and the film thickness of respective light emitting layers so that the lights from the first to third light emitting regions 161 to 163 will produce a predetermined color (mixed color) by additive mixing of colors.

More specifically, it is preferable to determine the light intensity of the lights from the first to third light emitting regions 161 to 163 so that the lights from the first to third light emitting regions 161 to 163 will macroscopically appear to be the predetermined color (mixed color) by additive mixing of colors.

SECOND EMBODIMENT

Figure 4:
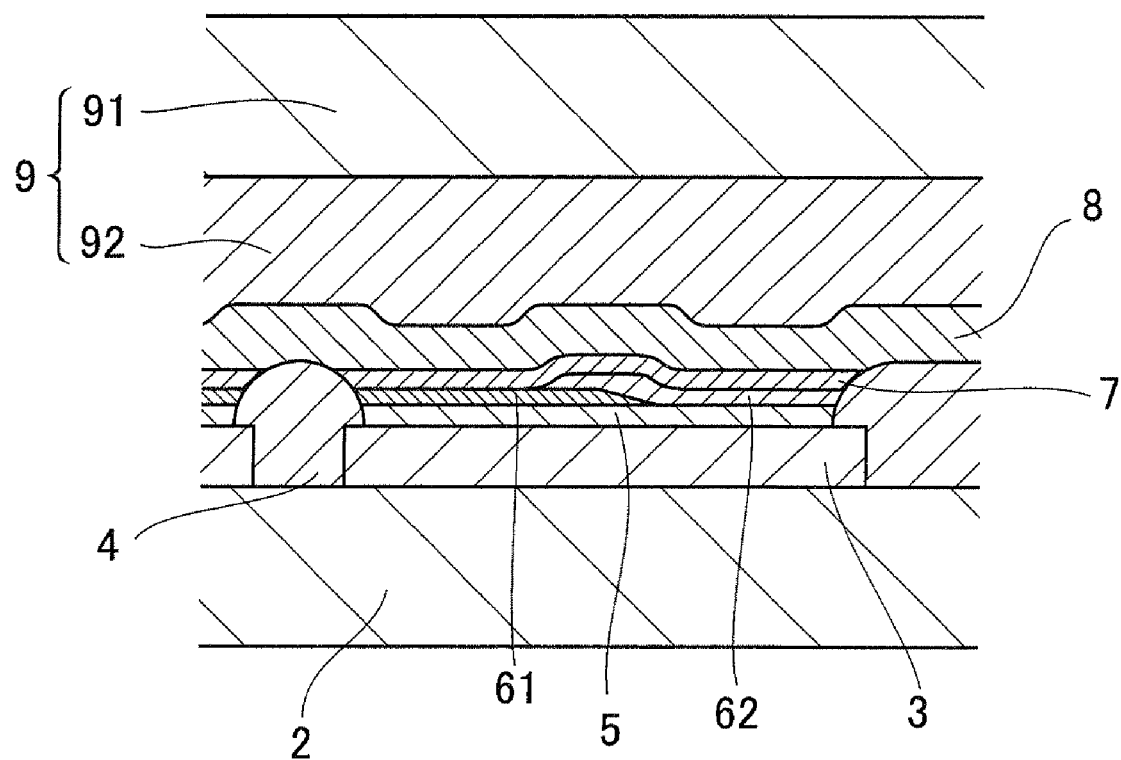
FIG. 4 is a diagram given for explanation of an optical device 1a according to a second embodiment of the present invention.

FIG. 4 is a diagram given for explanation of an optical device 1a according to a second embodiment of the present invention. A description of the same elements or functions as the first embodiment will be omitted. The optical device 1a according to the present embodiment includes a plurality of self light emitting elements aligned substantially in a grid on a substrate 2. In this optical device 1a, one organic EL element is used as one pixel. This optical device 1a is controlled by an input signal from an external circuit such as a power source circuit, a controller integrated circuit (IC) or the like to emit light or not from each of the self light emitting elements. The optical device 1a displays various information through emission/non-emission from these self light emitting elements. An organic EL panel that uses the organic EL elements, which are self light emitting elements, will be hereinafter described, as the optical device 1a. More specifically, the optical device 1a includes the substrate 2, a first electrode 3, an insulating film 4, a first charge transporting layer 5, a light emitting layer 6, a second charge transporting layer 7, a second electrode 8, and a sealing member 9, as shown in FIG. 4. The first charge transporting layer 5 is formed between the first electrode 3 and the light emitting layer 6. When the first electrode 3 is the hole injecting electrode (anode), the first charge transporting layer 5 is made of a hole transporting material such as NPB (N, N-di(naphthalene-1-yl)-N,N-diphenyl-benzidene). The second charge transporting layer 7 is formed between the light emitting layer 6 and the second electrode 8. When the second electrode 8 is the electron injecting electrode (cathode), the second charge transporting layer 7 is made of a charge transporting material such as aluminum complex ($Alq_3$).

[Manufacturing Method of the Optical Device]

One example of a manufacturing method of the optical device 1a will be described. The manufacturing method of the optical device 1a according to the present embodiment includes, for example, a first electrode formation step, a pixel region formation step (insulating film deposition), a first charge transporting layer formation step, a first light emitting layer formation step, a second light emitting layer formation step, a second charge transporting layer formation step, a second electrode formation step, a sealing step, and a post processing step.

[First Electrode Formation Step]

FIG. 5 includes diagrams given for explanation of a step of forming a first electrode in the manufacturing method of the optical device according to one embodiment of the present invention. FIG. 5A is a top plan view and FIG. 5B is a cross section of the region A and its surroundings in FIG. 5A.

First, a film of transparent electrode material such as indium tin oxide (ITO) or indium zinc oxide (IZO) or other conductive materials is deposited substantially uniformly on the substrate 2 made of a suitable material such as glass by sputtering or any other film forming techniques. After the deposition of the conductive film, predetermined patterns are formed in the film of the conductive material on the substrate 2 so as to form the first electrodes 3, which will be part of the organic EL element, and first electrode wirings 3a and second electrode wirings 3b for inputting control signals from external circuits to turn on and off the organic EL elements.

More specifically, as shown in FIG. 5A and FIG. 5B, a plurality of first electrode lines 3A consisting of the first electrodes 3 and first electrode wirings 3a and a plurality of second electrode wirings are formed in stripe patterns by photolithography or other applicable techniques. To planarize the surface of the first electrodes, polishing or etching may be performed to the film of conductive material deposited on the substrate or to the conductive material that has undergone patterning after film deposition. The patterning may be performed with a low resistance metal such as silver (Ag), aluminum (Al), or chromium (Cr) or an alloy thereof laminated on top of the first or second electrode wirings. In the present embodiment, the first electrode 3 will be described as the hole injecting electrode, but it can also be formed as the electron injecting electrode.

[Pixel Region Formation Step (Insulating Film Deposition)]

Figure 6:
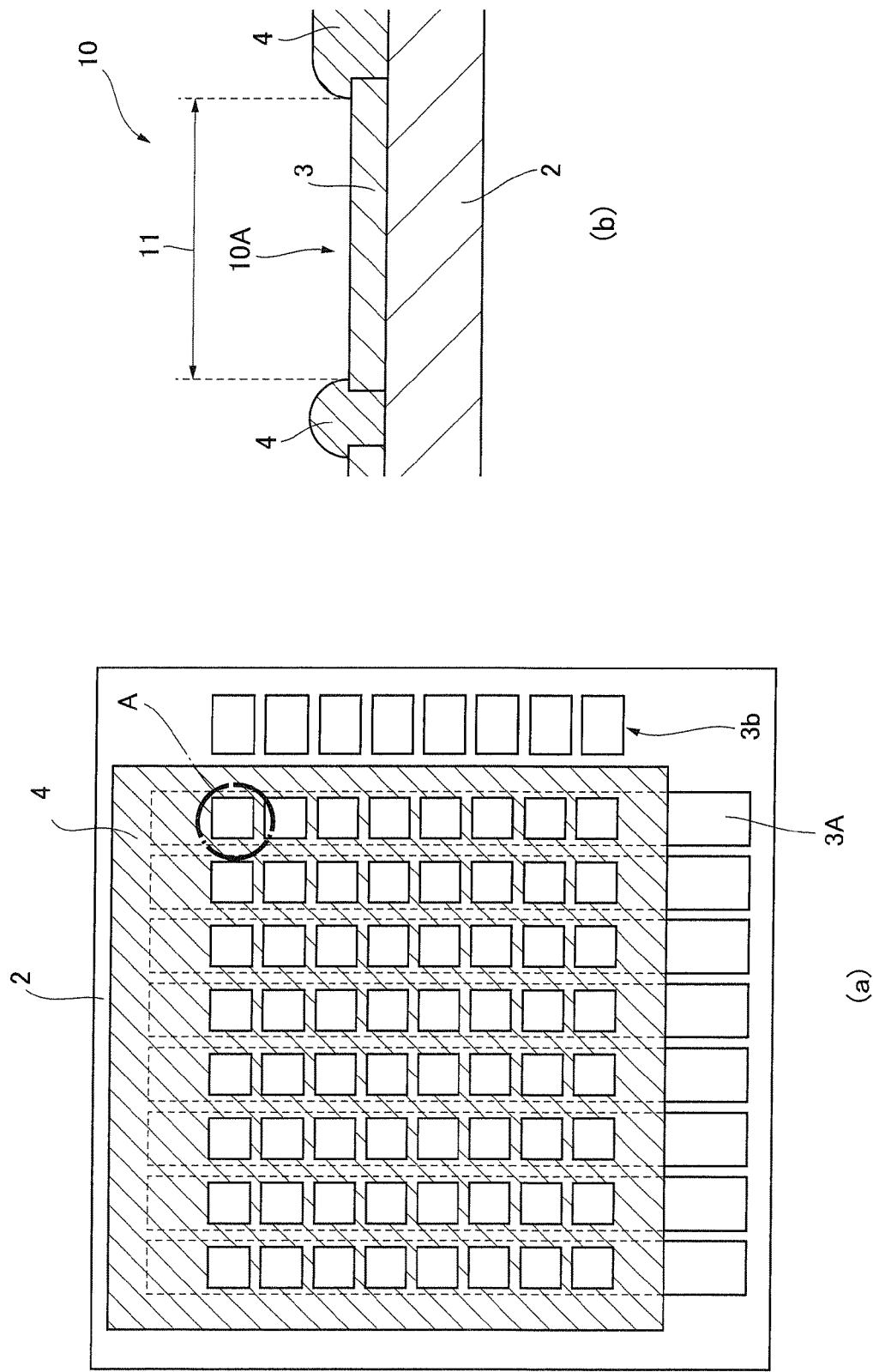
FIG. 6 includes diagrams given for explanation of a step of forming a pixel region (insulating film forming step) in the manufacturing method of the optical device according to one embodiment of the present invention, FIG. 6A being a top plan view and FIG. 6B being a cross section of the region A and its surroundings in FIG. 6A.

FIG. 6 includes diagrams given for explanation of a step of forming pixel regions (step of forming an insulating film) in the manufacturing method of the optical device according to one embodiment of the present invention. FIG. 6A is a top plan view and FIG. 6B is a cross section of the region A and its surroundings in FIG. 6A. As described above, one organic EL element is used as one pixel 10 in the optical device 1. A light emitting region 10A of one pixel 10 corresponds to the inside region of each of the openings 11, which are formed by the insulating film 4 partitioned as shown in FIG. 6A and FIG. 6B.

First, a film of insulating material such as polyimide or epoxy resin is deposited on the entire surface of the substrate 2 on the side on which the first electrodes have been formed by sputtering or other techniques. After that, the insulating film is patterned in a grid as shown in FIG. 6A and FIG. 6B. More specifically, the insulating film undergoes patterning along the lines in between the first electrode lines 3A aligned in stripes and along the direction orthogonal to these first electrode lines 3A. Although it appears from FIG. 6B that a plurality of insulating films may be present at both ends of each first electrode 3, the insulating film 4 in the present embodiment consists of one layer of insulating material, which is produced through one film forming step and the patterning in a predetermined shape as shown in FIG. 6A. Of course, the insulating film 4 may be produced by carrying out the film forming step and patterning several times. The purpose here is to achieve the optical device 1 according to the present invention. Alternatively, partition walls that will be used for patterning the second electrodes may be formed using the insulating material or the like in this pixel region formation step.

[First Charge Transporting Layer Formation Step]

Figure 7:
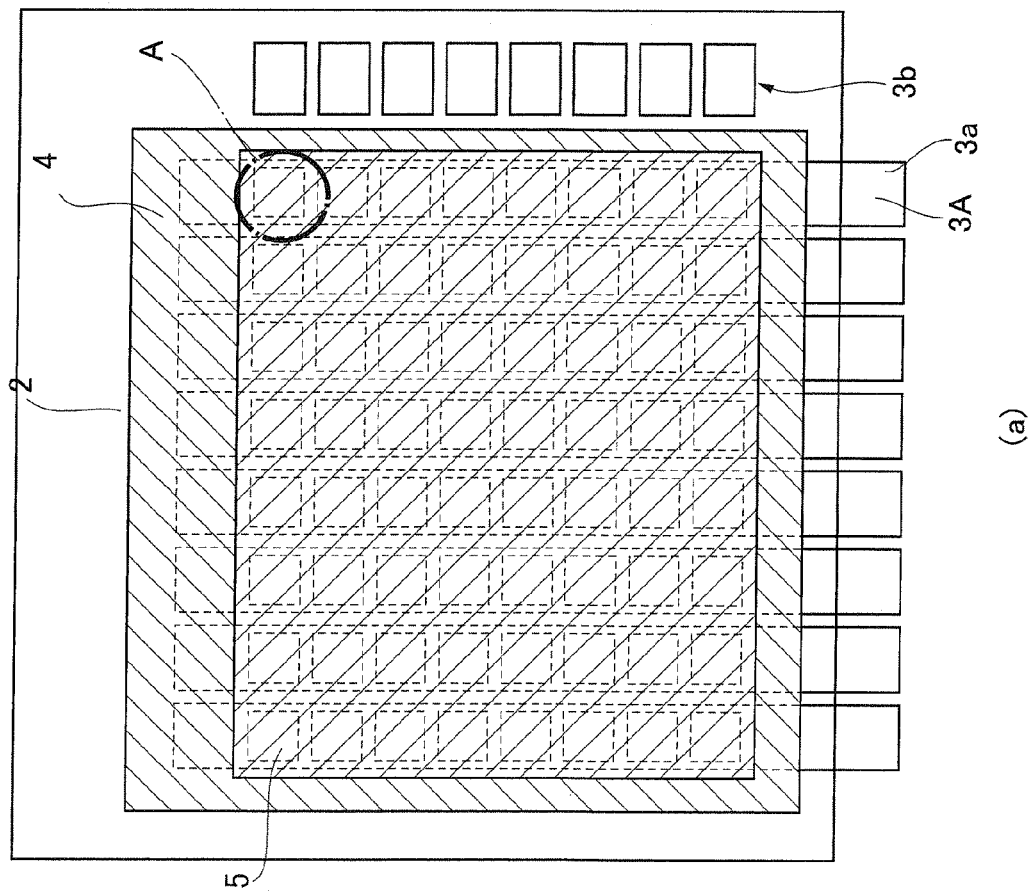
FIG. 7 includes diagrams given for explanation of a step of forming a first charge transporting layer in the manufacturing method of the optical device according to one embodiment of the present invention, FIG. 7A being a top plan view and FIG. 7B being a cross section of the region A and its surroundings in FIG. 7A.

FIG. 7 includes diagrams given for explanation of a step of forming a first charge transporting layer in the manufacturing method of the optical device according to one embodiment of the present invention. FIG. 7A is a top plan view and FIG. 7B is a cross section of the region A and its surroundings in FIG. 7A.

After the pixel region formation step described above, the substrate 2 formed with the first electrodes and insulating film 4 or the like undergoes a preprocessing step. The preprocessing can include, for example, a cleaning step using surfactant, pure water or the like, or various other cleaning steps such as UV (ultraviolet) irradiation cleaning or ozone cleaning.

After the preprocessing step, the substrate 2 is transferred into a film forming chamber that has been vacuumed to $1 \times 10^{-4}$ Pa, where the organic material is deposited by various techniques such as a resistance heating evaporation method, for example. Resistance heating evaporation is a film forming technique in which an evaporation source filled with the target material is heated in the film forming chamber where the substrate is set so that the target material is vaporized or sublimed and deposited in the aligned openings 11 in the insulating film 4. In the present embodiment, NPB is deposited as the first charge transporting layer 5 by the resistance heating evaporation method.

The first charge transporting layer 5 has the function of transporting holes (or electrons) injected from the first electrode into the light emitting layer. This first charge transporting layer 5 may have a single-layer structure, or a multilayer structure with two or more layers. The first charge transporting layer 5 may be formed of a single material, or its one layer may be made of several different materials. Furthermore, the first charge transporting layer 5 may be formed of a host material having high charge (hole) transportability, and a guest material having a high charge donating ability (charge acceptability) doped into the host material.

Since the first electrode 3 in the present embodiment corresponds to the hole injecting electrode, the first charge transporting layer 5 can be made of any of the materials commonly used for a hole transporting layer. When the first electrode 3 corresponds to the electron injecting electrode, the first charge transporting layer 5 can be made of any of the materials commonly used for an electron transporting layer. It should be noted that the first charge transporting layer 5 is not limited to the specifics of the embodiment described above, but can freely be designed in terms of material, film thickness, and film forming method, in accordance with various conditions such as situations or environments in which the optical device 1 will be used.

[First Light Emitting Layer Formation Step]

Figure 8:
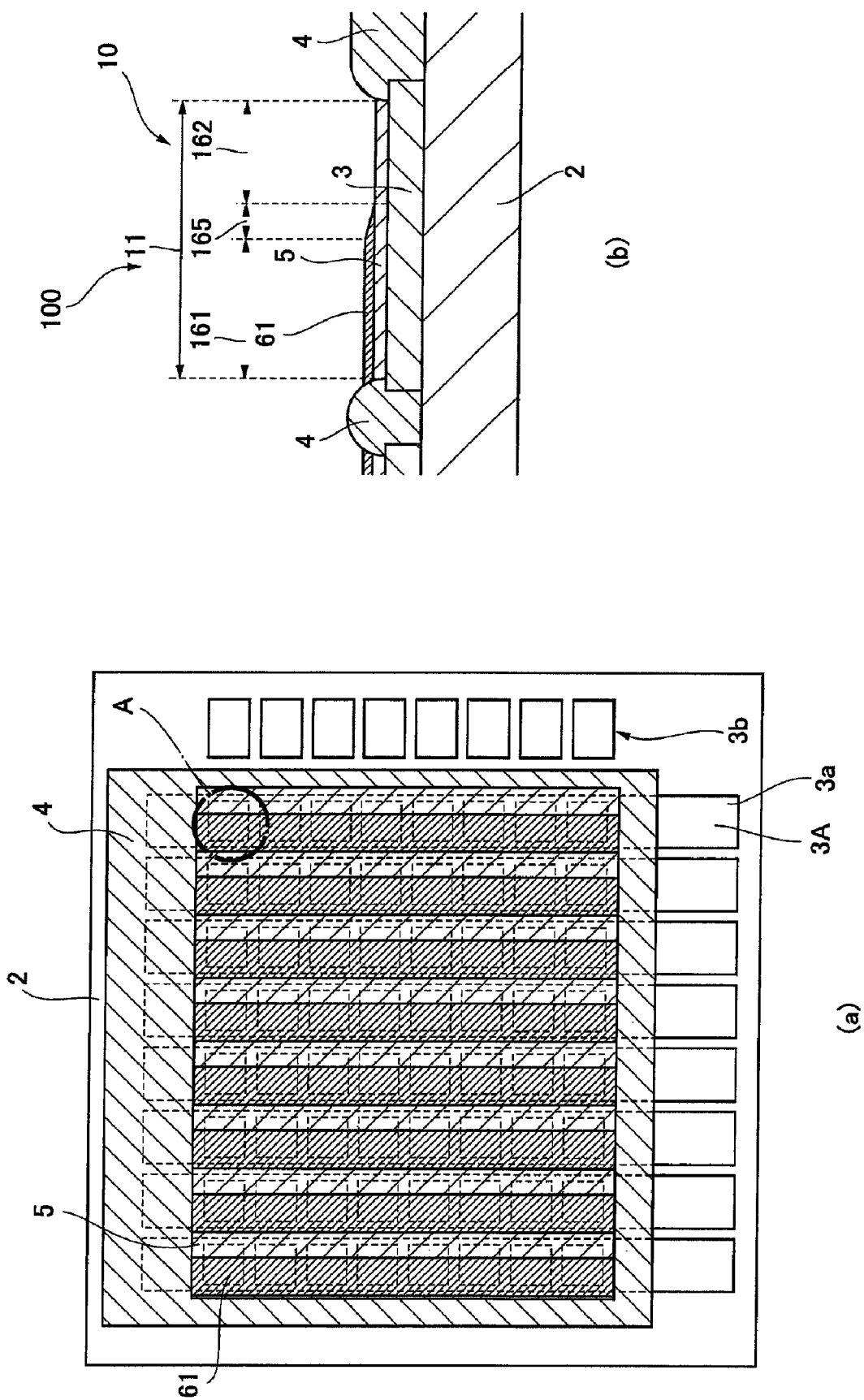
FIG. 8 includes diagrams given for explanation of a step of forming a first light emitting layer in the manufacturing method of the optical device according to one embodiment of the present invention, FIG. 8A being a top plan view and FIG. 8B being a cross section of the region A and its surroundings in FIG. 8A.

FIG. 8 includes diagrams given for explanation of a step of forming a first light emitting layer in the manufacturing method of the optical device according to one embodiment of the present invention. FIG. 8A is a top plan view and FIG. 8B is a cross section of the region A and its surroundings in FIG. 8A. FIG. 9 includes diagrams given for explanation of the film forming processes in the manufacturing method of the optical device according to one embodiment of the present invention. FIG. 9A is a diagram given for explanation of one specific example of a step of forming a first light emitting layer.

Next, the light emitting layer 6 is formed on the first charge transporting layer 5. According to the manufacturing method of the optical device 1 of the present invention, the first light emitting layer 61 and the second light emitting layer 62 are formed in consecutive order. More specifically, the first light emitting layer 61 is formed upon the first charge transporting layer 5 first. The first light emitting layer 61 is not formed on the entire surface of each of the openings 11, but formed such that the surfaces of the first charge transporting layer 5 and the first light emitting layer 61 are both visible at the opening when the self light emitting element 100 is viewed from above (film forming side of the substrate), as shown in FIG. 8A, FIG. 8B, and FIG. 9A. In the present embodiment, for example as shown in FIG. 9A, the first light emitting layer 61 is formed by a film forming method such as resistance heating evaporation, using a fluorescent organic material that emits red light such as a styryl dye (DCM1). More specifically, the above-mentioned substrate 2 is set inside a vacuum chamber, and the film material 261 from an evaporation source 600 is deposited on the substrate 2 through mask openings (openings) 71 in a shadow mask (mask) 70. Here, the positional relationship between the shadow mask 70 and the substrate 2 is determined so that the openings 71 in the shadow mask 70 substantially coincide with the first light emitting regions 161. The film material 261 is vapor-deposited on the first light emitting region 161 and on part of the third light emitting region 163. It is preferable to form the first light emitting layer 61 such that its film thickness is smaller in the third light emitting region 163 than in the first light emitting region 161. It is even more preferable to form the first light emitting layer 61 such that its film thickness in the third light emitting region 163 decreases from the side of the first light emitting region 161 towards the side of the second light emitting region 162. The first light emitting layer 61 is not limited to the specifics of the embodiment described above, but can be made of other materials, and can also have a host-guest layer structure. The light emitting material can be fluorescent or can also be phosphorescent.

[Second Light Emitting Layer Formation Step]

Figure 10:
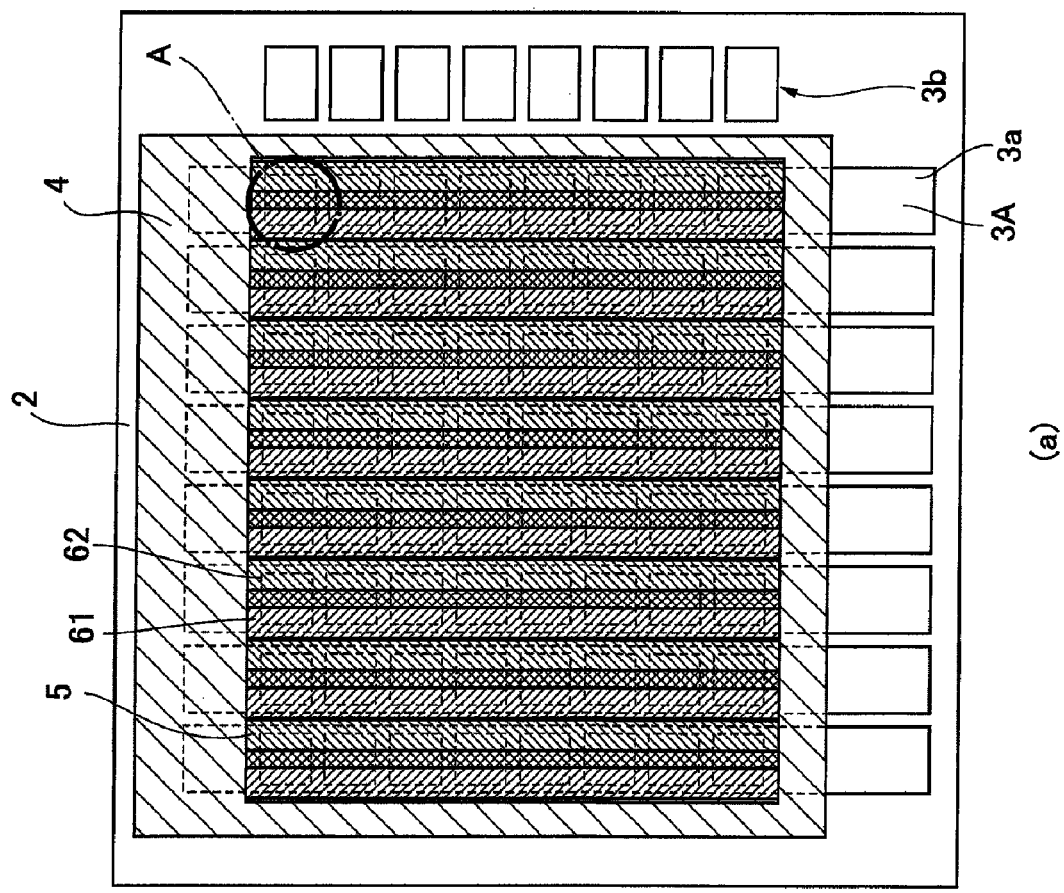
FIG. 10 includes diagrams given for explanation of a step of forming a second light emitting layer in the manufacturing method of the optical device according to one embodiment of the present invention, FIG. 10A being a top plan view and FIG. 10B being a cross section of the region A and its surroundings in FIG. 10A.

FIG. 10 includes diagrams given for explanation of a step of forming a second light emitting layer in the manufacturing method of the optical device according to one embodiment of the present invention. FIG. 10A is a top plan view and FIG. 10B is a cross section of the region A and its surroundings in FIG. 10A.

Next, the second light emitting layer 62 is formed on part of the region where the first light emitting layer 61 has been formed and on a region where no such first light emitting layer 61 has been formed in the same opening 11 of each pixel. More specifically, the light emitting layer 62 is formed on the region upon the first charge transporting layer 5, for example, where the first light emitting layer 61 has not been formed, and on an adjacent region. Here, the first light emitting region 161, second light emitting region 162, and a third light emitting region 163 are formed within the opening 11 of each pixel 10. More specifically, when viewed from the side opposite from the film forming side of the substrate 2 (from below in FIG. 10B), there are the first light emitting region 161 where the first light emitting layer only is formed, the second light emitting region 162 where the second light emitting layer only is formed, and the third light emitting region (laminated region) 163 where the first and second light emitting layers are stacked upon one another.

In the present embodiment, for example as shown in FIG. 9B, the second light emitting layer 62 is formed by a film forming method such as resistance heating evaporation, using a fluorescent organic material that emits blue light such as a distyryl derivative, a triazol derivative or the like. More specifically, the above-mentioned substrate 2 is set inside a vacuum chamber, and the film material 262 from an evaporation source 600 is deposited on the substrate 2 through mask openings 71 in the shadow mask 70. Here, the positional relationship between the shadow mask 70 and the substrate 2 is determined so that the openings 71 in the shadow mask 70 substantially coincide with the second light emitting regions 162. The film material 262 is vapor-deposited on the second light emitting region 162 and on part of the third light emitting region 163. It is preferable to form the second light emitting layer 62 such that its film thickness is smaller in the third light emitting region 163 than in the second light emitting layer 162. It is also preferable to form the second light emitting layer 62 such that its film thickness in the third light emitting region 163 increases from the side of the first light emitting region 161 towards the side of the second light emitting region 162. It is even more preferable to form the second light emitting layer such that the entire film thickness of each of the first to third light emitting regions 161 to 163 is substantially uniform. The second light emitting layer 62 is not limited to the specifics of the embodiment described above, but can be made of other materials, and can also have a host-guest layer structure. The light emitting material can be fluorescent or can also be phosphorescent.

Light emitting from this third light emitting region (laminated region) 163 appears macroscopically to be a color produced by additive mixing of colors of the lights from the first and second light emitting layers 61 and 62. The light emitting from the third light emitting region 163 in the present embodiment appears macroscopically to be white as a result of additive mixing of colors of the lights from the first and second light emitting layers 61 and 62.

[Second Charge Transporting Layer Formation Step]

Figure 11:
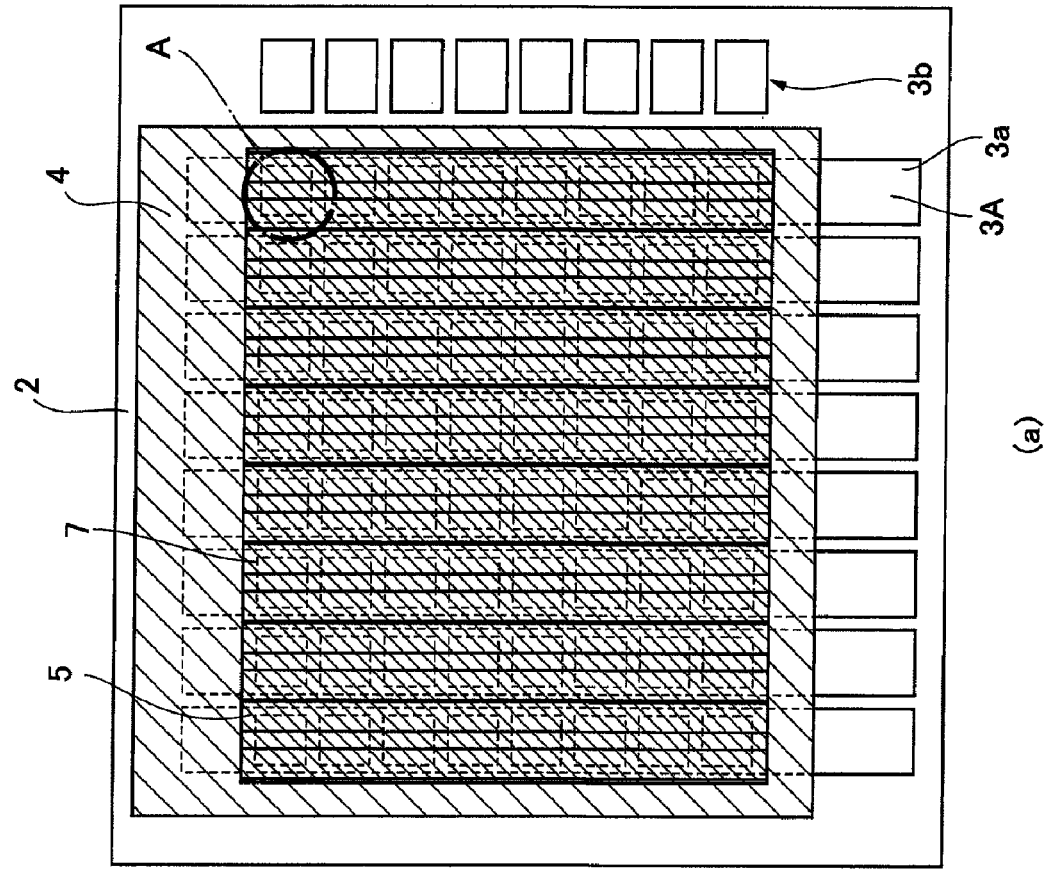
FIG. 11 includes diagrams given for explanation of a step of forming a second charge transporting layer in the manufacturing method of the optical device according to one embodiment of the present invention, FIG. 11A being a top plan view and FIG. 11B being a cross section of the region A and its surroundings in FIG. 11A.

FIG. 11 includes diagrams given for explanation of a step of forming a second charge transporting layer in the manufacturing method of the optical device according to one embodiment of the present invention. FIG. 11A is a top plan view and FIG. 11B is a cross section of the region A and its surroundings in FIG. 11A.

Next, the second charge transporting layer 7 is formed on the light emitting layer 6 (first light emitting layer 61 and second light emitting layer 62) by a film forming method such as resistance heating evaporation, for example, as shown in FIG. 11A and FIG. 11B, using aluminum complex ($Alq_3$) or various other materials. The second charge transporting layer 7 has the function of transporting electrons injected from the second electrode into the light emitting layer. This second charge transporting layer 7 may have a single-layer structure, or a multilayer structure with two or more layers. The second charge transporting layer 7 may be formed of a single material, or its one layer may be made of several different materials. Furthermore, the second charge transporting layer 7 may be formed of a host material having high charge transportability, and a guest material having a high charge donating ability (charge acceptability) doped into the host material.

Since the second electrode 8 in the present embodiment corresponds to the electron injecting electrode as will be described later, the second charge transporting layer 7 can be made of any of the materials commonly used for an electron transporting layer. It should be noted that the second charge transporting layer 7 is not limited to the specifics of the embodiment described above, but can freely be designed in terms of material, film thickness, and film forming method, in accordance with various conditions such as situations or environments in which the optical device 1 will be used.

[Second Electrode Formation Step]

Figure 12:
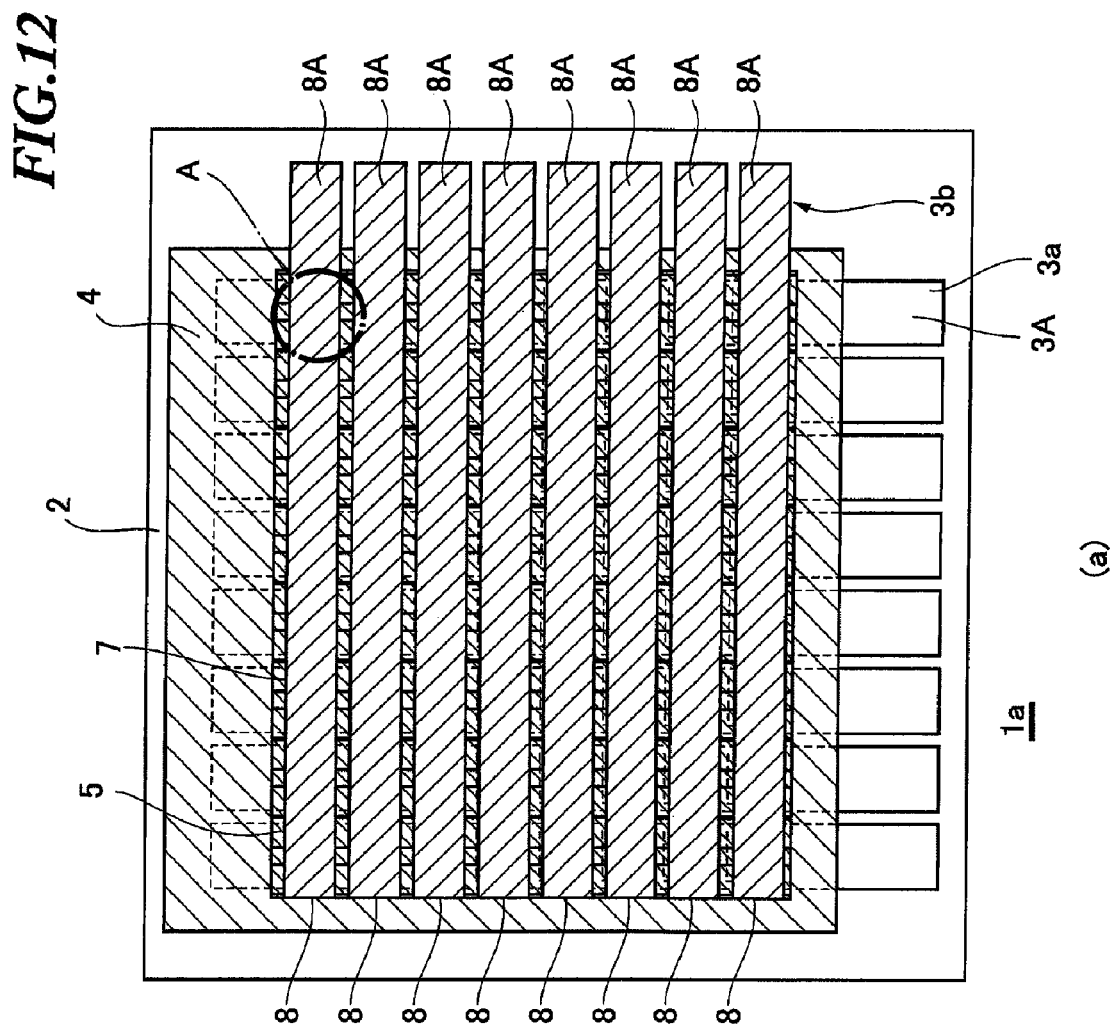
FIG. 12 includes diagrams given for explanation of a step of forming a second electrode in the manufacturing method of the optical device according to one embodiment of the present invention, FIG. 12A being a top plan view and FIG. 12B being a cross section of the region A and its surroundings in FIG. 12A.

FIG. 12 includes diagrams given for explanation of a step of forming a second electrode in the manufacturing method of the optical device according to one embodiment of the present invention. FIG. 12A is a top plan view and FIG. 12B is a cross section of the region A and its surroundings in FIG. 12A. The second electrode 8 is formed on the second charge transporting layer 7 that has been formed in the second charge transporting layer formation step. More specifically, the material that will form the second electrode is deposited and patterned upon the second charge transporting layer 7 along the direction orthogonal to the first electrode lines 3A so as to form the second electrodes 8. The second electrodes 8 formed in lines as shown in FIG. 12A are referred to as second electrode lines 8A. This patterning may be achieved by etching or the like using, for example, a film forming mask. Alternatively, partition walls having an inverted trapezoidal cross section may be formed preliminarily in parallel with the second electrode lines 8A (direction orthogonal to the first electrode lines 3A), and the second electrode material such as aluminum or the like may be deposited with these preformed partition walls in an inverted trapezoid shape, so as to form the second electrodes 8.

Here, the second electrode lines 8A are formed such that the second electrode wirings 3b formed on the substrate 2 and the second electrodes 8 formed upon the openings 11 are electrically connected to each other. In order for the second electrode 8 to function as the electron injecting electrode, a material that has a lower work function than the hole injecting electrode should be used. It is preferable, for example, to use a metal material such as aluminum (Al) or a magnesium alloy (Mg—Ag) or the like for the material that forms the second electrode 8. However, since aluminum has a relatively low electron injecting ability, when aluminum is used for the second electrode 8, it is preferable to provide an electron injecting layer made of lithium fluoride (LiF) between the second electrode 8 and the second charge transporting layer 7.

[Sealing Step and Postprocessing Step]

Figure 13:
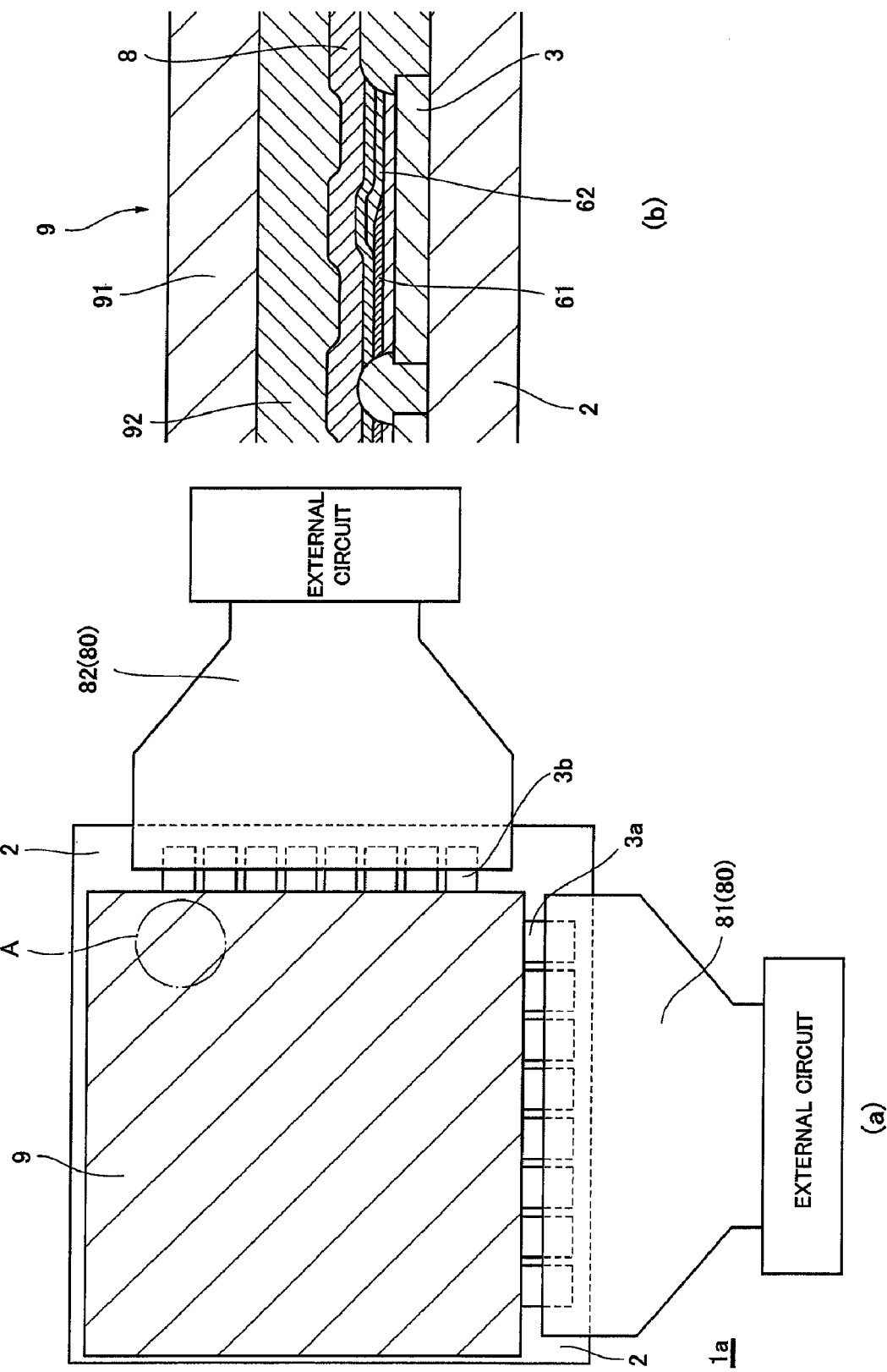
FIG. 13 includes diagrams given for explanation of a sealing step in the manufacturing method of the optical device according to one embodiment of the present invention.

FIG. 13 includes diagrams given for explanation of a sealing step in the manufacturing method of the optical device according to one embodiment of the present invention. After the second electrode formation step, a sealing step is performed using the sealing member. The sealing member 9 in the present embodiment includes a sealing substrate 91 made of a suitable material such as glass or metal, and a sealant 92 made of a suitable material such as resin. The sealing member 9 is bonded over the plurality of pixels 10 formed on the above-described substrate 2, to seal the self light emitting elements 100.

The sealing method is not limited to that of the embodiment described above. For example, a solid sealing structure may be formed by filling a sealing space formed between the substrate 2 and the sealing substrate 91 with a sealant 92 such as epoxy resin or the like in an airtight manner and solidifying the resin. Alternatively, liquid such as silicone oil may be employed as the material that forms the sealant 92 and the sealing space may be filled with this liquid so as to provide the seal. Alternatively, an airtight sealing method can be employed, wherein the sealing space is filled with inactive gas such as nitrogen ($N_2$). When gas sealing is adopted, it is preferable to place an adsorbent consisting of water retention material or the like inside the sealing space. By providing such adsorbent in the sealing space, deterioration factors of the organic EL element such as water entering the sealing space are reduced and deterioration of the organic EL element is prevented. Another possible sealing method is to form the sealing member 9 as a silicon nitride-oxide film with an aim to reduce the thickness of the optical device.

After the sealing step, the production chamber is set to the atmospheric level, and wiring substrates (flexible substrates) 80 are pressure bonded to the first and second electrode wirings 3a and 3b formed on the substrate 2 so that the thus fabricated self light emitting panel as described above and external circuits are electrically connected to each other. In the present embodiment, as shown in FIG. 13A, a first electrode flexible substrate 81 is pressure bonded to the first electrode wirings 3a, and a second electrode flexible substrate 82 is pressure bonded to the second electrode wirings 3b. Connection between the self light emitting panel and external circuits is not limited to the present embodiment described above. Various other mounting techniques can be employed for mounting external circuits, such as chip-on-glass (COG) wherein driving circuits are formed on the substrate 2, or flip-chip on glass (FOG) wherein driving circuits are formed on a flexible substrate, for example.

While the optical device 1 of the present invention is applied to a passive matrix organic EL panel in the embodiment described above, the invention is not limited to this particular embodiment. For example, the optical device 1 of the present invention can be applied to an active matrix organic EL panel that includes TFTs (thin film transistors) as switching elements for each of the organic EL elements. As long as the optical device 1 according to the present invention is realized, its application should not be limited to that of the embodiment described above.

The present invention is not limited to the embodiment described above. Specific examples and alternatives given above can be used in various combinations. While the pixel design according to the present invention applies to all of the pixels of the optical device 1 in the embodiment described above, the first and second light emitting regions, and preferably the third light emitting region, too, according to the present invention can be formed in the same openings of some of the pixels.

While the embodiment described above employs vacuum deposition as a film forming method, the invention is not limited to this. Various other film forming techniques such as coating, printing, or laser heat transfer can be employed.

In the embodiment described above, the film thickness of the first light emitting layer 61 decreases from the side of the first light emitting region 161 towards the second light emitting region 162 in the third light emitting region 163 while the film thickness of the second light emitting layer 62 increases from the side of the first light emitting region 161 towards the second light emitting region 162. The invention is not limited to this design and the first and second light emitting layers 61 and 62 can have substantially the same film thickness in the third light emitting region 163.

Figure 14:
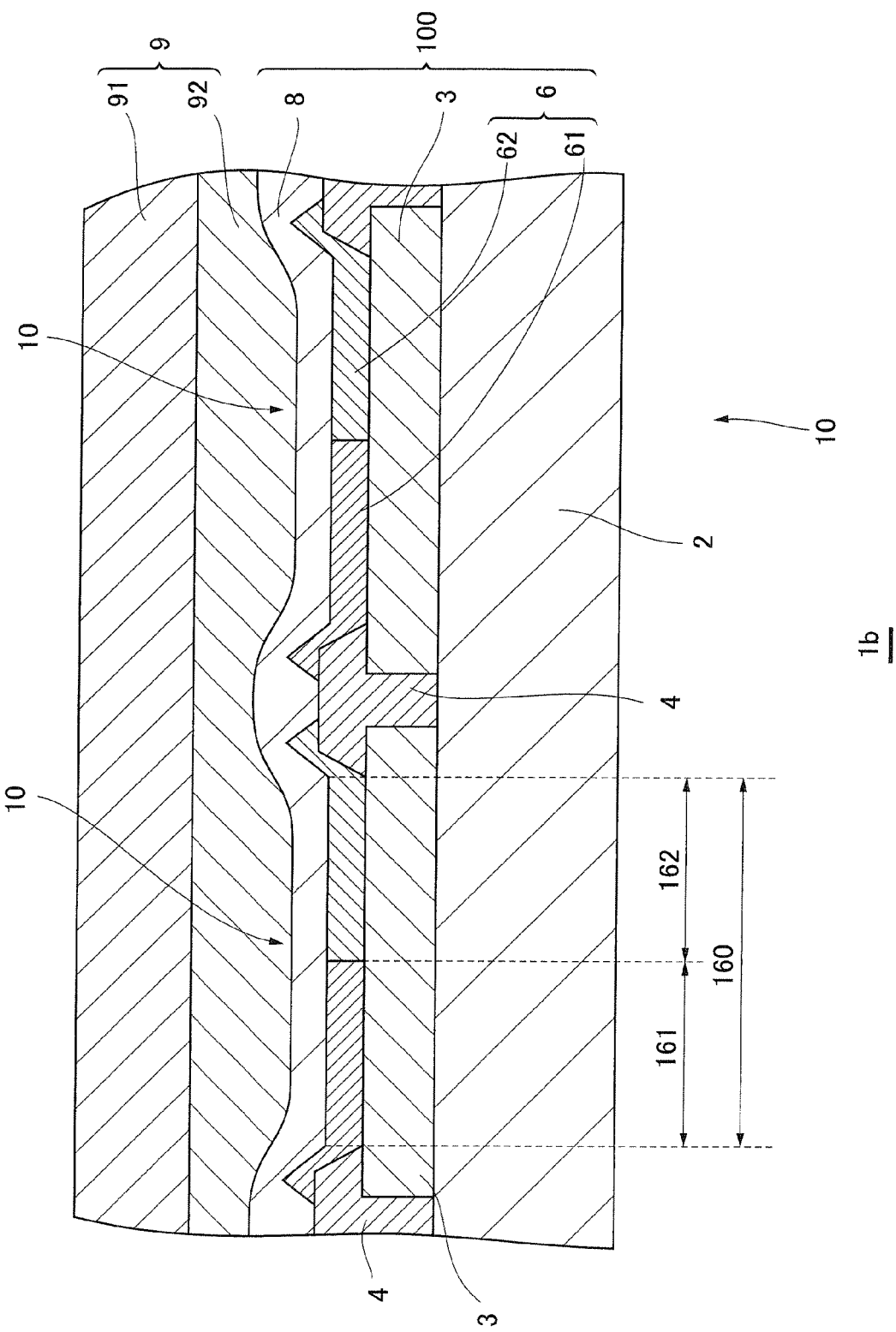
FIG. 14 is a diagram given for explanation of an optical device according to another embodiment of the present invention.

Also in the embodiment described above, the first to third light emitting regions consisting of the first and second light emitting layers 61 and 62 are formed on the same plane within one pixel, but the invention is not limited to this design. For example, as shown in FIG. 14, the light emitting layer 6 may consist only of a first light emitting region 161 where a first light emitting layer 61 is formed for emitting light of a first color, and a second light emitting region 162 where a second light emitting layer 62 is formed for emitting light of a second color on the same plane in one pixel 10, without any third light emitting region 163. The optical device 1b having such a design can emit light of a predetermined color (mixed color) from each pixel with an even more simple structure because there is no need of forming the third light emitting region 163 where overlapping parts of the first and second light emitting layers 61 and 62 are laminated upon one another.

Figure 15:
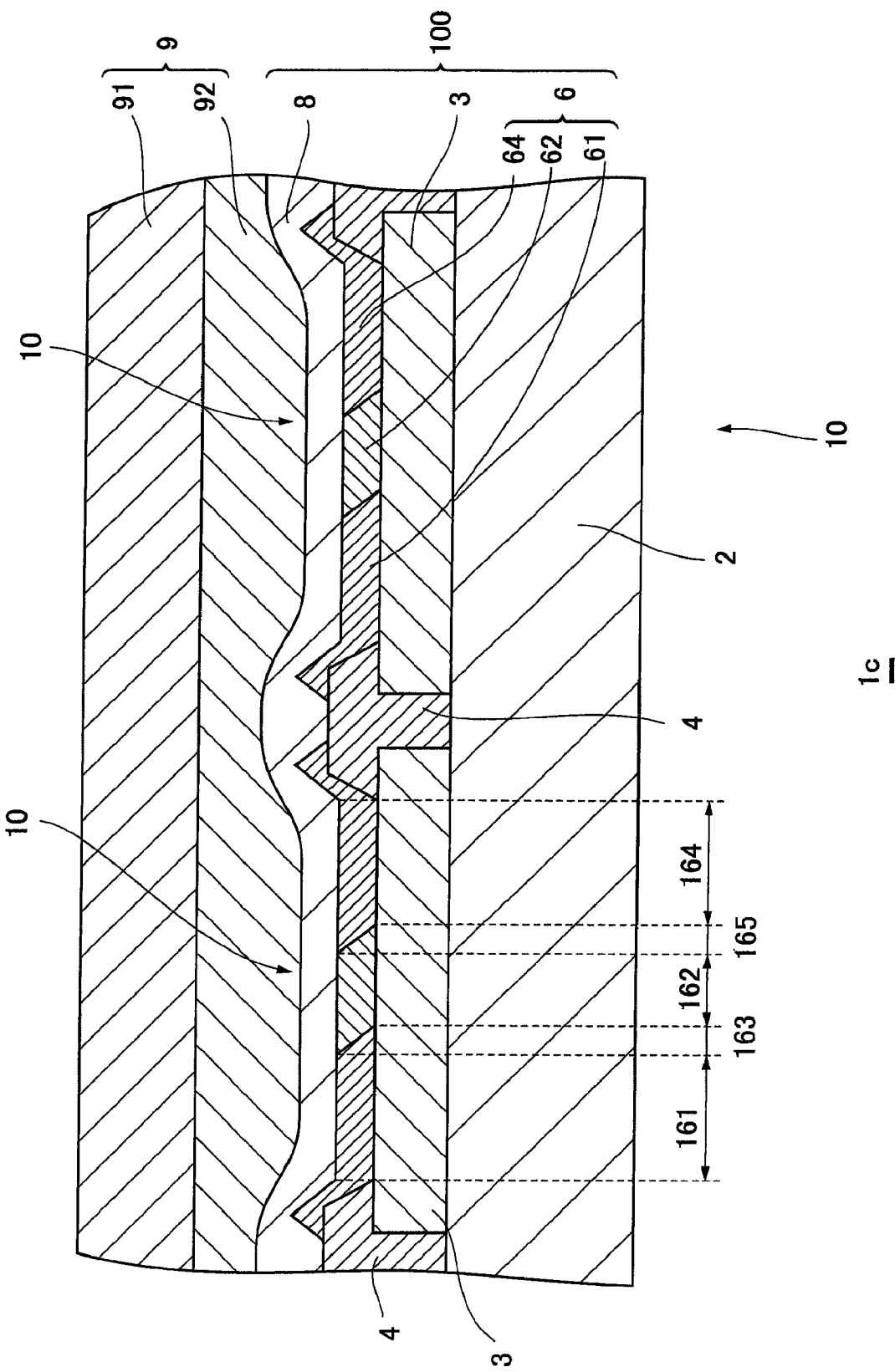
FIG. 15 is a diagram given for explanation of an optical device according to another embodiment of the present invention.

While the two types of light emitting layers 61 and 62 are formed on the same plane in the same opening of each pixel in the embodiment described above, the invention is not limited to this design. Several types of light emitting layers can be formed in the same opening of each pixel. An optical device having such a design can emit light of a predetermined color (mixed color) from one pixel alone. More specifically, such an optical device 1c includes, as shown in FIG. 15, a first light emitting region 161 that emits light of a first color, a second light emitting region 162 that emits light of a second color, and a fourth light emitting region 164 that emits light of a third color. A third light emitting layer 64 that emits light of the third color is formed in the fourth light emitting region 164. Moreover, the optical device 1c includes a third light emitting region 163 between the first and second light emitting regions 161 and 162 where the first and second light emitting layers 61 and 62 are stacked upon one another so as to emit light of a color which is a mixture of the first and second colors from the first and second light emitting layers 61 and 62 within the same opening of one pixel. The optical device 1c also includes a fifth light emitting region 165 between the second and fourth light emitting regions 162 and 164 where the second and third light emitting layers 62 and 64 are stacked upon one another so as to emit light of a color which is a mixture of the second and third colors from the second and third light emitting layers 62 and 64 within the same opening of one pixel. The optical device 1c with such a design as described above can emit light of a predetermined color (mixed color) from one pixel by suitably setting the film thickness of respective light emitting layers, the area of respective regions, and the lamination structure.

Hereinafter, the optical device 1 produced through the manufacturing method of the optical device 1 according to the embodiment of the present invention will be described as regards specific examples, which shall not limit the scope of the invention.

First, the organic EL element will be described. Generally, an organic EL element has a structure wherein an organic EL functional layer is interposed between an anode (hole injecting electrode) and a cathode (electron injecting electrode). When a voltage is applied across both electrodes, holes injected from the anode and transported into the organic EL functional layer and electrons injected from the cathode and transported into the organic EL functional layer recombine in the layer (light emitting layer), thereby emitting light. The organic EL element includes a substrate, a lower electrode, a film layer consisting of the organic EL functional layer, and an upper electrode laminated upon one another. Specific designs and examples of materials of the organic EL element are as follows.

The substrate can preferably be in the form of a flat plate or a film having transparency, the material being for example glass or plastic.

One of the upper and lower electrodes will be the cathode, the other being the anode. In this instance, the anode may be made of a material having a high work function; it is a transparent conductive film consisting of a film of metal such as chromium (Cr), molybdenum (Mo), nickel (Ni), platinum (Pt) or the like, or a film of metal oxide such as ITO, IZO or the like. The cathode may be made of a material having a low work function; metals that have a low work function, particularly, the alkali metals (Li, Na, K, Rb, Cs), the alkali earth metals (Be, Mg, Ca, Sr, Ba), and rare earths, compounds of these metals, or alloys containing these metals can be used. When both of the upper and lower electrodes are formed of a transparent material, another design would be possible wherein one electrode that is on the opposite side from the light emitting side is provided with a reflection film.

The wires extending out from the upper or lower electrodes into the sealing space are wirings provided for connecting the organic EL panel to driving means such as ICs (integrated circuits) or drivers for driving the panel, and are preferably made of a low resistance metal material such as Ag, Cr, Al or the like, or an alloy of these metals.

Generally, the lower electrodes and their wires are formed through the processes in which a thin film of the lower electrodes and wires is formed by vapor deposition or sputtering using ITO, IZO or the like, after which the film is patterned by photolithography or the like. The lower electrodes and the wires which particularly need to have low resistance may have a double-layer structure, in which low resistance metal such as Ag, Al, Cr or the like or an alloy of these metals is laminated upon an underlayer of ITO, IZO or the like noted above. Alternatively, a triple-layer structure may be employed, in which a material having a high oxidation resistance such as Cu, Cr, Ta or the like is additionally laminated as a protection layer of Ag or the like.

The organic EL functional layer formed between the upper and lower electrodes generally includes, when the lower electrode is the anode and the upper electrode is the cathode, a hole transporting layer, a light emitting layer, and an electron transporting layer laminated upon one another (when the lower electrode is the cathode and the upper electrode is the anode, the lamination order is reversed). Either or both of the hole transporting layer and the electron transporting layer may be omitted so that there is only the light emitting layer. The organic EL functional layer may further include a hole injecting layer, an electron injecting layer, a hole blocking layer, an electron blocking layer or the like, interposed as required according to the applications.

The materials for the organic EL functional layer can be selected from various options depending on the intended use of the organic EL elements. Examples include, but not limited to, the following:

The material for the hole transporting layer can be suitably selected from various known compounds so that the layer can exhibit high hole mobility. Examples of usable organic materials include: a porphyrin compound such as copper phthalocyanine; an aromatic tertiary amine such as 4,4'-bis [N-(1-naphthyl)-N-phenylamino]-biphenyl (NPB); a stilbenzene compound such as 4-(di-p-tolylamino)-4'-[4-(di-p-tolylamino)styryl]stilbenzene; a triazole derivative; and a styryl amine compound. A blend of high-molecular material can also be used, which for example contains a low-molecular organic material for the purpose of hole transportation dispersed in a high-molecular material such as polycarbonate. Preferably, the material may have a higher glass transition temperature (Tg) than the temperature at which the sealing resin is cured by heat, one preferred example being 4,4'-bis [N-(1-naphthyl)-N-phenylamino]-biphenyl (NPB).

For the light emitting layer, various known luminescent materials can be used. Examples of the material for the layer include fluorescent organic materials including an aromatic dimethylidyne compound such as 4,4'-bis(2,2'-diphenyl vinyl)-biphenyl (DPVBi), a styryl benzene compound such as 1,4-bis(2-methyl styryl)benzene, a triazole derivative such as 3-(4-biphenyl)-4-phenyl-5-t-butylphenyl-1,2,4-triazole (TAZ), an anthraquinone derivative, and a fluorenone derivative; a fluorescent organic metal compound such as (8-hydroxyquinolinato) aluminum complex ($Alq_3$); polymer materials such as polypara-phenylenevinylenes (PPV), polyfluorenes, and polyvinyl carbazoles (PVK); and organic materials that can utilize phosphorescence associated with triplet excitons of a platinum complex or an iridium complex for emission of light. The light emitting layer may be formed of these luminescent materials alone, or can contain a hole transporting material, an electron transporting material, an additive (donor, acceptor, etc.), or a luminescent dopant. Alternatively, these materials may be dispersed in a polymer material or inorganic material.

The material for the electron transporting layer can be suitably selected from various known compounds so that the layer can exhibit the function of transporting the electrons injected from the cathode into the light emitting layer. For example, organic materials such as a nitro-substituted fluorenone derivative, an anthraquinodimethan derivative or the like, a metal complex of an 8-quinolinol derivative, and metal phthalocyanine or the like can be used.

The hole transporting layer, light emitting layer, and electron transporting layer described above can be formed through any of wet processes such as spin coating, dipping or other coating techniques, ink-jet, screen printing, or dry processes such as vapor deposition or laser transfer, except for the layers formed by simultaneous or alternate film-forming or heating process steps according to the method of the present invention.

The material for the sealing member is not particularly limited as long as it can secure airtightness, but it is preferable to use a material that has a low thermal expansion coefficient and shows little secular change, because the adhesive is cured by application of heat. For example, glass material such as alkaline glass or non-alkaline glass, metal such as stainless steel or aluminum, or plastic can be employed. The sealing member can be composed of a glass sealing substrate formed with sealing recesses (whether drilled to one depth or two depths) by press-forming, etching, blast processing or the like, or a flat glass plate, with a sealing space being formed between the glass substrate and a glass (or plastic) spacer. Another possible design is to fill the airtight space between the sealing member and the substrate with resin or the like.

The sealant (adhesive) 92 can be any of a thermosetting adhesive, a two-part chemical curing adhesive, or a light (UV) curing adhesive or the like. Acrylic resins, epoxy resins, polyesters, polyolefins can be used as the material. Use of a UV curing epoxy resin adhesive is particularly preferable.

Drying means (desiccant) can be placed in the sealing space between the substrate and the sealing member. Such drying means can be formed using any of physical desiccants such as zeolite, silica gel, carbon, carbon nanotube or the like, chemical desiccants such as alkaline metal oxides, metalhalogen compounds, chloride dioxide or the like, desiccants obtained by dissolving an organic metal complex in a petroleum solvent such as toluene, xylene, and an aliphatic organic solvent, or desiccants obtained by dispersing desiccant particles in a binder having transparency such as polyethylene, polyisoprene, polyvinyl cinnamate or the like.

The optical device to which the embodiment of the present invention is adopted can be a bottom-emission type organic EL element, in which light is emitted from the substrate side, or a top-emission type organic EL element in which light is emitted from the opposite side from the substrate (upper electrode side). Also, as noted above, the organic EL element can either be a passive-matrix driving type or an active-matrix driving type.

As described above, the optical device 1 (1a) according to the present invention includes one or a plurality of self light emitting elements 100, each of which serves as one pixel 10 and includes a pair of electrodes (first electrode 3 and second electrode 8) formed on a substrate 2 and at least a light emitting layer 6 interposed between the electrodes. The light emitting layer 6 includes, within one pixel 10, a first light emitting layer 61 that at least emits light of a first color and a second light emitting layer 62 that emits light of a second color that is different from the first color, and each pixel 10 includes, within an identical opening, a first light emitting region 161 that emits the first color light and a second light emitting region 162 that emits the second color light, so that each pixel is capable of emitting a predetermined color (mixed color) other than the intrinsic colors of the light emitting layers. More preferably, in addition to the first and second light emitting regions 161 and 162, the same opening 11 in one pixel 10 includes a third light emitting region 163 for emitting light of a color that is a mixture of the first color and the second color, so that each pixel is capable of emitting lights of the first and second colors and a mixed color of these colors.

With a conventional light emitting panel device that drives pixels of several types of colors, intrinsic colors of the pixels become visible separately in proximity to the light emitting panel. In contrast, with the optical device according to the present invention having the structure described above, since each pixel emits a first color light, a second color light, and a light of a mixed color of the first and second colors, one sees even in closer proximity as compared to the conventional case that each pixel emits a predetermined color (mixed color). For example, when the optical device according to the present invention adopts a red light emitting layer as the first light emitting layer 61 and a blue light emitting layer as the second light emitting layer 62, each pixel is capable of emitting white light, which is achieved by mixing of the two colors.

Moreover, with the optical device 1 (1a) according to the present invention, the same opening 11 of each pixel includes at least the first light emitting region 161 and the second light emitting region 162 and preferably the third light emitting region 163, whereby the number of drive lines (electrodes) necessary for achieving a predetermined color (mixed color) is reduced as compared to the conventional light emitting panel device that drives the pixels of several types of colors.

Also, with the optical device 1 (1a) according to the present invention, the same opening 11 of each pixel includes at least the first light emitting region 161 and the second light emitting region 162 and preferably the third light emitting region 163, whereby the aperture ratio necessary for achieving a predetermined color (mixed color) is increased as compared to the conventional light emitting panel device that drives the pixels of several types of colors, the pixels being, for example, arranged in a flat plane panel.

Moreover, the optical device according to the present invention is capable of emitting light of a predetermined color (mixed color) from each pixel by suitably setting, for example, the materials and film thickness of the first and second light emitting layers 61 and 62, or the area of each light emitting region, whereby better color representation is achieved as compared to the conventional techniques. When the optical device of the present invention is employed as the light source of an optical communication device, for example, this improved color representation leads to a larger spectral width of the wavelength component in a light signal used for the optical communication.

In a preferred embodiment, the first light emitting layer 61 has a smaller film thickness in the third light emitting region 163 than in the first light emitting region 161, and/or the second light emitting layer 62 has a smaller film thickness in the third light emitting region 163 than in the second light emitting region 162. This prevents the entire film thickness in the third light emitting region 163 from becoming excessively large as compared to the film thickness in, for example, the first or the second light emitting region 161 or 162.

Moreover, in the third light emitting region 163, the film thickness of the first light emitting layer 61 decreases from the side of the first light emitting region 161 towards the side of the second light emitting region 162, while the film thickness of the second light emitting layer 62 increases from the side of the first light emitting region 161 towards the side of the second light emitting region 162. This enables emission of light of a mixed color with the rate of mixing of the first and second colors being changed smoothly continuously from the first light emitting region 161 side towards the second light emitting region 162 side, or conversely, from the second light emitting region side towards the first light emitting region side.

Furthermore, the area ratio of at least the first light emitting region 161 and the second light emitting region 162 and preferably of the third light emitting region 163, too, may be predetermined so that the mixed color of the lights from these regions will be a predetermined color. Thereby, each pixel can emit a predetermined mixed color.

Likewise, the intensities of lights from the first to third light emitting regions 161 to 163 may be determined so that the mixed color of the lights from these regions will be a predetermined mixed color. Thereby, each pixel can emit a predetermined mixed color.

Moreover, since the first to third light emitting regions 161 to 163 are formed within the same opening 11 of each pixel, the first or second light emitting layer 61 or 62 need not have electron or hole transportability at least in the first or second light emitting region 161 or 162. Of course, each layer 61 or 62 can have electron or hole transportability. The above feature reduces limitations on the selection of organic materials or production processes of the optical device.

The method for manufacturing an optical device according to the present invention includes a first step (first electrode formation step) of forming a first electrode 3 directly or via another layer on a substrate 2; a second step (pixel region formation step) of providing an insulating layer 4 partitioned into sections on the first electrode 3 so as to form openings 11 that functions as pixels 10; a third step (first light emitting layer formation step and second light emitting layer formation step) of forming a light emitting layer 6 in the openings 11; and a fourth step (second electrode formation step) of forming a second electrode 8 directly or via another layer on the light emitting layer 6. In the third step, the light emitting layer 6 including a first light emitting layer 61 that at least emits light of a first color and a second light emitting layer 62 that emits light of a second color that is different from the first color is provided in each one of the pixels 10, and a first light emitting region 161 that emits light of the first color and a second light emitting region 162 that emits light of the second color are formed in an identical opening 11 of each pixel. Preferably, in addition to the first and second light emitting regions 161 and 162, a third light emitting region 163 that emits light of a mixed color of the first and second colors is formed in the same opening 11 of each pixel, and thus an optical device capable of emitting, from each pixel, light of a predetermined color (mixed color) other than the intrinsic colors of the organic layers is produced through simple process steps.

More specifically, the method includes: a first electrode formation step of forming a first electrode directly or via another layer on a substrate 2; a pixel region formation step of providing an insulating layer 4 partitioned into sections on the first electrode 3 so as to form openings 11 that function as pixels 10; a first light emitting layer formation step of forming a first light emitting layer 61 on part of the opening 11 of each pixel; a second light emitting layer formation step of forming a second light emitting layer 62 on part of the region in the same opening 11 of each pixel where the first light emitting layer 61 has been formed and on a region where the first light emitting layer 61 has not been formed; and a second electrode formation step of forming a second electrode 8 after the formation of the second light emitting layer. Thus an optical device capable of emitting, from each pixel, light of a predetermined color (mixed color) other than the intrinsic colors of the organic layers is produced through simple process steps.

The invention claimed is:

1. An optical device comprising one or a plurality of self light emitting elements, each of which serves as one pixel and includes a pair of electrodes formed on a substrate and at least a light emitting layer interposed between the electrodes, said one or a plurality of self light emitting elements being formed within openings formed by partitioning an insulating layer into sections, wherein said light emitting layer includes, within said openings, a first light emitting layer that at least emits light of a first color and a second light emitting layer that emits light of a second color which is different from said first color, and each pixel includes, within each of said an openings, a first light emitting region that emits light of said first color and a second light emitting region that emits light of said second color, and a third light emitting region that emits light of a color that is a mixture of said first color and said second color.

2. The optical device according to claim 1, wherein said first light emitting layer and said second light emitting layer are laminated upon one another in said third light emitting region.

3. The optical device according to claim 1, wherein said third light emitting region is formed between said first light emitting region and said second light emitting region within said opening.

4. The optical device according to claim 1, wherein either the first light emitting layer formed in said third light emitting region has a smaller film thickness than the first light emitting layer formed in said first light emitting region, or the second light emitting layer formed in said third light emitting region has a smaller film thickness than the second light emitting layer formed in said second light emitting region.

5. The optical device according to claim 1, wherein in said third light emitting region, said first light emitting layer has a film thickness that decreases from a side of the first light emitting region towards a side of the second light emitting region and said second light emitting layer has a film thickness that increases from the side of the first light emitting region towards the side of the second light emitting region.

6. The optical device according to claim 1, wherein at least said first light emitting region and said second light emitting region have a predetermined area ratio within each opening of each pixel.

7. The optical device according to claim 1, wherein intensities of lights from said first light emitting region, said second light emitting region, and said third light emitting region are determined so that a mixed color of lights from said first to third light emitting regions becomes a predetermined mixed color.

8. A method for manufacturing an optical device including one or a plurality of self light emitting elements, each of which is one pixel and includes a pair of electrodes and at least a light emitting layer interposed between the electrodes, said one or a plurality of self light emitting elements being formed within openings formed by partitioning an insulating layer into sections, the method comprising: a first step of forming a first electrode directly or via another layer on a substrate; a second step of providing an insulating layer partitioned into sections on said first electrode so as to form openings that function as pixels; a third step of forming a light emitting layer in said openings; and a fourth step of forming a second electrode directly or via another layer on said light emitting layer, wherein in said third step, the light emitting layer including a first light emitting layer that emits at least light of a first color and a second light emitting layer that emits light of a second color that is different from the first color is provided in each one of said pixels, a first light emitting region that emits said first color light and a second light emitting region that emits said second color light are formed in each opening of each pixel, and a third light emitting region that emits light of a color that is a mixture of said first color and said second color.

9. The method for manufacturing an optical device according to claim 8, wherein said first light emitting layer and said second light emitting layer are laminated upon one another in said third light emitting region in said third step.

10. The method according to claim 8, wherein said third light emitting region is formed between said first light emitting region and said second light emitting region in said third step.

11. A method for manufacturing an optical device including one or a plurality of self light emitting elements, each of which is one pixel and includes a pair of electrodes and at least a light emitting layer interposed between the electrodes, said one or a plurality of self light emitting elements being formed within openings formed by partitioning an insulating layer into sections, the method comprising: a first electrode formation step of forming a first electrode directly or via another layer on a substrate; a pixel region formation step of providing an insulating layer partitioned into sections on said first electrode so as to form openings that function as pixels; a first light emitting layer formation step of forming a first light emitting layer on part of the opening of one of said pixels; a second light emitting layer formation step of forming a second light emitting layer on part of the region in the same opening of one of the pixels where said first light emitting layer has been formed and on a region where said first light emitting layer has not been formed; a second electrode formation step of forming a second electrode after the formation of said second light emitting layer; said part of the region where both the first light emitting layer and the second light emitting layer are formed emits light that is a mixture of said first light and said second light; the first light emitting layer portion located outside said part of the region emits the first light; and the second light emitting layer portion located outside said part of the region emits the second light.

* * * * *